United States Patent
Wang et al.

(10) Patent No.: US 12,374,656 B2
(45) Date of Patent: Jul. 29, 2025

(54) MULTI-CHIP MODULES FORMED USING WAFER-LEVEL PROCESSING OF A RECONSTITUTED WAFER

(71) Applicant: ADEIA SEMICONDUCTOR TECHNOLOGIES LLC, San Jose, CA (US)

(72) Inventors: Liang Wang, Newark, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 17/835,851

(22) Filed: Jun. 8, 2022

(65) Prior Publication Data
US 2022/0375864 A1    Nov. 24, 2022

Related U.S. Application Data

(60) Continuation of application No. 16/712,357, filed on Dec. 12, 2019, now Pat. No. 11,387,214, which is a
(Continued)

(51) Int. Cl.
*H01L 25/065*    (2023.01)
*H01L 21/56*    (2006.01)
(Continued)

(52) U.S. Cl.
CPC ........ *H01L 25/0652* (2013.01); *H01L 21/566* (2013.01); *H01L 21/568* (2013.01);
(Continued)

(58) Field of Classification Search
CPC ............. H01L 23/5386; H01L 23/5381; H01L 25/0652; H01L 23/3135; H01L 21/566;
(Continued)

(56) References Cited

U.S. PATENT DOCUMENTS

| 4,998,665 A | 3/1991 | Hayashi |
| 5,019,673 A | 5/1991 | Juskey et al. |

(Continued)

FOREIGN PATENT DOCUMENTS

| CN | 103681646 | 3/2014 |
| CN | 115995455 A | 4/2023 |

(Continued)

OTHER PUBLICATIONS

Yu et al., Study of 15μm Pitch Solder Microbumps for 3D IC Integration, 2009, Electronic Components and Technology Conference, pp. 6-10. (Year: 2009).*

(Continued)

*Primary Examiner* — Syed I Gheyas
(74) *Attorney, Agent, or Firm* — Knobbe, Martens, Olson & Bear, LLP

(57) ABSTRACT

Apparatuses and methods are described. This apparatus includes a bridge die having first contacts on a die surface being in a molding layer of a reconstituted wafer. The reconstituted wafer has a wafer surface including a layer surface of the molding layer and the die surface. A redistribution layer on the wafer surface includes electrically conductive and dielectric layers to provide conductive routing and conductors. The conductors extend away from the die surface and are respectively coupled to the first contacts at bottom ends thereof. At least second and third IC dies respectively having second contacts on corresponding die surfaces thereof are interconnected to the bridge die and the redistribution layer. A first portion of the second contacts are interconnected to top ends of the conductors opposite the bottom ends thereof in part for alignment of the at least second and third IC dies to the bridge die.

30 Claims, 10 Drawing Sheets

Related U.S. Application Data continuation of application No. 16/246,863, filed on Jan. 14, 2019, now Pat. No. 10,546,834, which is a division of application No. 15/624,494, filed on Jun. 15, 2017, now Pat. No. 10,217,720.

(51) Int. Cl.

| | | |
|---|---|---|
| *H01L 21/768* | (2006.01) | |
| *H01L 23/00* | (2006.01) | |
| *H01L 23/31* | (2006.01) | |
| *H01L 23/538* | (2006.01) | |
| *H01L 25/00* | (2006.01) | |
| *H01L 25/16* | (2023.01) | |
| *H01L 23/498* | (2006.01) | |

(52) U.S. Cl.
CPC .... *H01L 21/76877* (2013.01); *H01L 23/3114* (2013.01); *H01L 23/3135* (2013.01); *H01L 23/5381* (2013.01); *H01L 23/5386* (2013.01); *H01L 24/19* (2013.01); *H01L 24/20* (2013.01); *H01L 24/24* (2013.01); *H01L 24/32* (2013.01); *H01L 24/73* (2013.01); *H01L 24/82* (2013.01); *H01L 24/96* (2013.01); *H01L 24/97* (2013.01); *H01L 25/0655* (2013.01); *H01L 25/16* (2013.01); *H01L 25/50* (2013.01); *H01L 21/561* (2013.01); *H01L 23/3128* (2013.01); *H01L 23/49816* (2013.01); *H01L 23/49838* (2013.01); *H01L 24/05* (2013.01); *H01L 24/08* (2013.01); *H01L 24/16* (2013.01); *H01L 2224/04105* (2013.01); *H01L 2224/08145* (2013.01); *H01L 2224/12105* (2013.01); *H01L 2224/16145* (2013.01); *H01L 2224/24145* (2013.01); *H01L 2224/32145* (2013.01); *H01L 2224/32225* (2013.01); *H01L 2224/73204* (2013.01); *H01L 2224/73209* (2013.01); *H01L 2224/73253* (2013.01); *H01L 2224/821* (2013.01); *H01L 2224/92124* (2013.01); *H01L 2224/96* (2013.01); *H01L 2224/97* (2013.01); *H01L 2225/06527* (2013.01); *H01L 2225/06548* (2013.01); *H01L 2225/06562* (2013.01); *H01L 2225/06586* (2013.01); *H01L 2924/14* (2013.01); *H01L 2924/18161* (2013.01); *H01L 2924/18162* (2013.01); *H01L 2924/182* (2013.01); *H01L 2924/183* (2013.01)

(58) Field of Classification Search
CPC . H01L 21/568; H01L 21/76877; H01L 24/19; H01L 24/20; H01L 24/24; H01L 24/32; H01L 24/73; H01L 24/82; H01L 24/96; H01L 24/97; H01L 24/05; H01L 24/08; H01L 24/16; H01L 25/0655; H01L 25/16; H01L 23/3114; H01L 23/3128; H01L 23/49816; H01L 23/49838
See application file for complete search history.

(56) References Cited

U.S. PATENT DOCUMENTS

| | | | |
|---|---|---|---|
| 5,051,802 A | 9/1991 | Prost et al. | |
| 5,087,585 A | 2/1992 | Hayashi | |
| 5,322,593 A | 6/1994 | Hasegawa et al. | |
| 5,729,896 A | 3/1998 | Dalal et al. | |
| 5,753,536 A | 5/1998 | Sugiyama et al. | |
| 5,771,555 A | 6/1998 | Eda et al. | |
| 5,854,507 A | 12/1998 | Miremadi et al. | |
| 5,956,605 A | 9/1999 | Akram et al. | |
| 5,985,739 A | 11/1999 | Plettner et al. | |
| 5,998,808 A | 12/1999 | Matsushita | |
| 6,008,126 A | 12/1999 | Leedy | |
| 6,080,640 A | 6/2000 | Gardner et al. | |
| 6,121,688 A | 9/2000 | Akagawa | |
| 6,265,775 B1 | 7/2001 | Seyyedy | |
| 6,374,770 B1 | 4/2002 | Lee | |
| 6,410,983 B1 | 6/2002 | Moriizumi et al. | |
| 6,423,640 B1 | 7/2002 | Lee et al. | |
| 6,465,892 B1 | 10/2002 | Suga | |
| 6,500,694 B1 | 12/2002 | Enquist | |
| 6,582,991 B1 | 6/2003 | Maeda et al. | |
| 6,768,208 B2 | 7/2004 | Lin et al. | |
| 6,782,610 B1 | 8/2004 | Iijima et al. | |
| 6,867,073 B1 | 3/2005 | Enquist | |
| 6,887,769 B2 | 5/2005 | Kellar et al. | |
| 6,908,027 B2 | 6/2005 | Tolchinsky et al. | |
| 6,962,835 B2 | 11/2005 | Tong et al. | |
| 7,045,453 B2 | 5/2006 | Canaperi et al. | |
| 7,078,811 B2 | 7/2006 | Suga | |
| 7,105,980 B2 | 9/2006 | Abbott et al. | |
| 7,126,212 B2 | 10/2006 | Enquist et al. | |
| 7,193,423 B1 | 3/2007 | Dalton et al. | |
| 7,319,197 B2 | 1/2008 | Oggioni et al. | |
| 7,354,798 B2 | 4/2008 | Pogge et al. | |
| 7,385,283 B2 | 6/2008 | Wu et al. | |
| 7,554,203 B2 | 6/2009 | Zhou et al. | |
| 7,566,634 B2 | 7/2009 | Beyne et al. | |
| 7,582,971 B2 | 9/2009 | Kameyama et al. | |
| 7,589,409 B2 | 9/2009 | Gibson et al. | |
| 7,663,231 B2 | 2/2010 | Chang et al. | |
| 7,750,488 B2 | 7/2010 | Patti et al. | |
| 7,759,751 B2 | 7/2010 | Ono | |
| 7,786,572 B2 | 8/2010 | Chen | |
| 7,803,693 B2 | 9/2010 | Trezza | |
| 7,816,856 B2 | 10/2010 | Cok et al. | |
| 7,843,052 B1 | 11/2010 | Yoo et al. | |
| 7,897,481 B2 | 3/2011 | Chiou et al. | |
| 7,932,616 B2 | 4/2011 | Meguro | |
| 7,977,789 B2 | 7/2011 | Park | |
| 8,049,303 B2 | 11/2011 | Osaka et al. | |
| 8,064,224 B2 | 11/2011 | Mahajan et al. | |
| 8,168,458 B2 | 5/2012 | Do et al. | |
| 8,178,963 B2 | 5/2012 | Yang | |
| 8,178,964 B2 | 5/2012 | Yang | |
| 8,183,127 B2 | 5/2012 | Patti et al. | |
| 8,193,632 B2 | 6/2012 | Chang et al. | |
| 8,227,904 B2 | 7/2012 | Braunisch et al. | |
| 8,241,961 B2 | 8/2012 | Kim et al. | |
| 8,263,434 B2 | 9/2012 | Pagaila et al. | |
| 8,314,007 B2 | 11/2012 | Vaufredaz | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,519,514 B2 | 8/2013 | Fujii | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,691,601 B2 | 4/2014 | Izuha | |
| 8,697,493 B2 | 4/2014 | Sadaka | |
| 8,716,105 B2 | 5/2014 | Sadaka et al. | |
| 8,791,575 B2 | 7/2014 | Oganesian et al. | |
| 8,802,538 B1 | 8/2014 | Liu | |
| 8,809,123 B2 | 8/2014 | Liu et al. | |
| 8,841,002 B2 | 9/2014 | Tong | |
| 8,872,349 B2 | 10/2014 | Chiu et al. | |
| 8,878,353 B2 | 11/2014 | Haba et al. | |
| 8,901,748 B2 | 12/2014 | Manusharow et al. | |
| 8,912,670 B2 | 12/2014 | Teh et al. | |
| 8,975,726 B2 | 3/2015 | Chen et al. | |
| 8,987,137 B2 | 3/2015 | Bachman et al. | |
| 8,988,299 B2 | 3/2015 | Kam et al. | |
| 9,006,908 B2 | 4/2015 | Pincu et al. | |
| 9,029,242 B2 | 5/2015 | Holden et al. | |
| 9,054,101 B2 | 6/2015 | Semmelmeyer et al. | |
| 9,093,350 B2 | 7/2015 | Endo et al. | |
| 9,126,236 B2 | 9/2015 | Roos et al. | |

(56) References Cited

U.S. PATENT DOCUMENTS

| | | |
|---|---|---|
| 9,136,293 B2 | 9/2015 | Yee et al. |
| 9,142,517 B2 | 9/2015 | Liu et al. |
| 9,153,552 B2 | 10/2015 | Teh et al. |
| 9,159,690 B2 | 10/2015 | Chiu |
| 9,171,756 B2 | 10/2015 | Enquist et al. |
| 9,171,816 B2 | 10/2015 | Teh et al. |
| 9,184,125 B2 | 11/2015 | Enquist et al. |
| 9,190,380 B2 | 11/2015 | Teh et al. |
| 9,224,697 B1 | 12/2015 | Kwon et al. |
| 9,224,704 B2 | 12/2015 | Landru |
| 9,230,941 B2 | 1/2016 | Chen et al. |
| 9,252,172 B2 | 2/2016 | Chow et al. |
| 9,257,399 B2 | 2/2016 | Kuang et al. |
| 9,269,701 B2 | 2/2016 | Starkston et al. |
| 9,275,971 B2 | 3/2016 | Chiu et al. |
| 9,299,736 B2 | 3/2016 | Chen et al. |
| 9,312,198 B2 | 4/2016 | Meyer et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,349,703 B2 | 5/2016 | Chiu et al. |
| 9,355,997 B2 | 5/2016 | Katkar et al. |
| 9,368,866 B2 | 6/2016 | Yu |
| 9,373,527 B2 | 6/2016 | Yu et al. |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,443,824 B1 | 9/2016 | We et al. |
| 9,461,007 B2 | 10/2016 | Chun et al. |
| 9,466,586 B1 | 10/2016 | Choi et al. |
| 9,476,898 B2 | 10/2016 | Takano |
| 9,496,239 B1 | 11/2016 | Edelstein et al. |
| 9,524,959 B1 | 12/2016 | Yeh et al. |
| 9,536,848 B2 | 1/2017 | England et al. |
| 9,559,081 B1 | 1/2017 | Lai et al. |
| 9,601,353 B2 | 3/2017 | Huang et al. |
| 9,620,481 B2 | 4/2017 | Edelstein et al. |
| 9,627,365 B1 | 4/2017 | Yu et al. |
| 9,656,852 B2 | 5/2017 | Cheng et al. |
| 9,666,502 B2 | 5/2017 | Chen et al. |
| 9,666,559 B2 | 5/2017 | Wang et al. |
| 9,666,560 B1 | 5/2017 | Wang et al. |
| 9,704,827 B2 | 7/2017 | Huang et al. |
| 9,722,098 B1 | 8/2017 | Chung et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,754,866 B2 | 9/2017 | Wang et al. |
| 9,768,133 B1 | 9/2017 | Wu et al. |
| 9,780,042 B2 | 10/2017 | Woychik et al. |
| 9,799,587 B2 | 10/2017 | Fujii et al. |
| 9,818,729 B1 | 11/2017 | Chiu et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,180 B2 | 4/2018 | Kim et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,966,360 B2 | 5/2018 | Yu et al. |
| 10,002,852 B1 | 6/2018 | Hu et al. |
| 10,008,844 B2 | 6/2018 | Wang et al. |
| 10,026,605 B2 | 7/2018 | Doub et al. |
| 10,032,722 B2 | 7/2018 | Yu et al. |
| 10,033,582 B2 | 7/2018 | Shanimugam et al. |
| 10,074,630 B2 | 9/2018 | Kelly et al. |
| 10,075,657 B2 | 9/2018 | Fahim et al. |
| 10,170,409 B2 | 1/2019 | Ganesan et al. |
| 10,204,893 B2 | 2/2019 | Uzoh et al. |
| 10,269,619 B2 | 4/2019 | Yu et al. |
| 10,269,756 B2 | 4/2019 | Uzoh |
| 10,269,853 B2 | 4/2019 | Katkar et al. |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,529,690 B2 | 1/2020 | Shih et al. |
| 10,546,834 B2 | 1/2020 | Wang et al. |
| 10,559,507 B1 | 2/2020 | Saketi et al. |
| 10,629,567 B2 | 4/2020 | Uzoh et al. |
| 10,707,087 B2 | 7/2020 | Uzoh et al. |
| 10,707,145 B2 | 7/2020 | Bultitude et al. |
| 10,727,204 B2 | 7/2020 | Agarwal et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,833,052 B2 | 11/2020 | Shih |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,910,344 B2 | 2/2021 | DeLaCruz et al. |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,145,626 B2 | 10/2021 | Hwang et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,222,863 B2 | 1/2022 | Hua et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,437,423 B2 | 9/2022 | Takachi |
| 11,462,419 B2 | 10/2022 | Haba |
| 11,476,213 B2 | 10/2022 | Haba et al. |
| 11,538,781 B2 | 12/2022 | Haba |
| 11,558,029 B2 | 1/2023 | Ito |
| 11,631,647 B2 | 4/2023 | Haba |
| 11,652,083 B2 | 5/2023 | Uzoh et al. |

(56) References Cited

U.S. PATENT DOCUMENTS

| | | |
|---|---|---|
| 11,728,273 B2 | 8/2023 | Haba |
| 11,764,177 B2 | 9/2023 | Haba |
| 11,764,189 B2 | 9/2023 | Gao et al. |
| 11,817,409 B2 | 11/2023 | Haba et al. |
| 11,837,582 B2 | 12/2023 | Gao et al. |
| 11,916,076 B2 | 2/2024 | DeLaCruz et al. |
| 11,935,907 B2 | 3/2024 | Katkar |
| 12,176,294 B2 | 12/2024 | Haba |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2003/0148591 A1 | 8/2003 | Guo et al. |
| 2004/0084414 A1 | 5/2004 | Sakai et al. |
| 2004/0140546 A1 | 7/2004 | Lee et al. |
| 2004/0157407 A1 | 8/2004 | Tong et al. |
| 2004/0188501 A1 | 9/2004 | Tolchinsky et al. |
| 2004/0238927 A1 | 12/2004 | Miyazawa |
| 2005/0040530 A1 | 2/2005 | Shi |
| 2005/0133930 A1 | 6/2005 | Savastisuk et al. |
| 2005/0153522 A1 | 7/2005 | Hwang et al. |
| 2005/0218518 A1 | 10/2005 | Jiang et al. |
| 2006/0057945 A1 | 3/2006 | Hsu et al. |
| 2006/0087042 A1 | 4/2006 | Kameyama et al. |
| 2006/0278331 A1 | 12/2006 | Dugas et al. |
| 2007/0007639 A1 | 1/2007 | Fukazawa et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0122635 A1 | 5/2007 | Lu et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0036082 A1 | 2/2008 | Eun |
| 2008/0079105 A1 | 4/2008 | Chang et al. |
| 2008/0231311 A1 | 9/2008 | Condorelli et al. |
| 2008/0265421 A1 | 10/2008 | Brunnbauer et al. |
| 2008/0308928 A1 | 12/2008 | Chang |
| 2009/0068831 A1 | 3/2009 | Enquist et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2009/0321939 A1 | 12/2009 | Chandrasekaran |
| 2010/0081236 A1 | 4/2010 | Yang et al. |
| 2010/0123268 A1 | 5/2010 | Menard |
| 2010/0129999 A1 | 5/2010 | Zingher et al. |
| 2010/0167534 A1 | 7/2010 | Iwata |
| 2010/0213819 A1 | 8/2010 | Cok et al. |
| 2010/0258952 A1 | 10/2010 | Fjelstad |
| 2010/0259166 A1 | 10/2010 | Cok et al. |
| 2010/0327424 A1 | 12/2010 | Braunisch et al. |
| 2011/0074033 A1 | 3/2011 | Kaltalioglu et al. |
| 2011/0186977 A1 | 8/2011 | Chi et al. |
| 2011/0290552 A1 | 12/2011 | Palmateer et al. |
| 2012/0025396 A1 | 2/2012 | Liao et al. |
| 2012/0049344 A1 | 3/2012 | Pagaila et al. |
| 2012/0074585 A1 | 3/2012 | Koo et al. |
| 2012/0119360 A1 | 5/2012 | Kim et al. |
| 2012/0187516 A1 | 7/2012 | Sato |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2012/0217644 A1 | 8/2012 | Pagaila |
| 2013/0009325 A1 | 1/2013 | Mori |
| 2013/0032390 A1 | 2/2013 | Hu et al. |
| 2013/0037936 A1 | 2/2013 | Choi et al. |
| 2013/0037962 A1 | 2/2013 | Xue |
| 2013/0082399 A1 | 4/2013 | Kim et al. |
| 2013/0122655 A1 | 5/2013 | Yu et al. |
| 2013/0241080 A1 | 9/2013 | Pagaila |
| 2013/0265733 A1 | 10/2013 | Herbsommer et al. |
| 2013/0299997 A1 | 11/2013 | Sadaka |
| 2013/0334697 A1 | 12/2013 | Shin et al. |
| 2014/0013606 A1 | 1/2014 | Nah et al. |
| 2014/0071652 A1 | 3/2014 | McShane et al. |
| 2014/0154839 A1 | 6/2014 | Ahn et al. |
| 2014/0175655 A1 | 6/2014 | Chen et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0327150 A1 | 11/2014 | Jung et al. |
| 2014/0370658 A1 | 12/2014 | Tong et al. |
| 2014/0377909 A1 | 12/2014 | Chung et al. |
| 2015/0021754 A1 | 1/2015 | Lin et al. |
| 2015/0048500 A1 | 2/2015 | Yu et al. |
| 2015/0064498 A1 | 3/2015 | Tong |
| 2015/0102468 A1 | 4/2015 | Kang et al. |
| 2015/0113195 A1 | 4/2015 | Kim |
| 2015/0130082 A1 | 5/2015 | Lu et al. |
| 2015/0171050 A1 | 6/2015 | Chen et al. |
| 2015/0179481 A1 | 6/2015 | Lin |
| 2015/0194406 A1 | 7/2015 | Teh et al. |
| 2015/0206865 A1 | 7/2015 | Yu et al. |
| 2015/0235991 A1 | 8/2015 | Gu et al. |
| 2015/0262845 A1 | 9/2015 | Hwang et al. |
| 2015/0270209 A1 | 9/2015 | Woychik et al. |
| 2015/0303173 A1 | 10/2015 | Maydar et al. |
| 2015/0340285 A1 | 11/2015 | Enquest et al. |
| 2015/0371938 A1 | 12/2015 | Katkar et al. |
| 2016/0126634 A1 | 5/2016 | Liu et al. |
| 2016/0163650 A1 | 6/2016 | Gao et al. |
| 2016/0260684 A1 | 9/2016 | Zhai et al. |
| 2016/0300813 A1 | 10/2016 | Zhai et al. |
| 2016/0300817 A1 | 10/2016 | Do et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2016/0343695 A1* | 11/2016 | Lin ............... H01L 23/528 |
| 2016/0372323 A1 | 12/2016 | Doub et al. |
| 2016/0379967 A1 | 12/2016 | Gamini |
| 2017/0023405 A1 | 1/2017 | Fahim et al. |
| 2017/0062366 A1 | 3/2017 | Enquist |
| 2017/0062383 A1 | 3/2017 | Yee et al. |
| 2017/0084576 A1* | 3/2017 | Yu ............... H01L 21/56 |
| 2017/0179078 A1 | 4/2017 | Yu et al. |
| 2017/0125379 A1 | 5/2017 | Chen et al. |
| 2017/0148764 A1 | 5/2017 | Wang et al. |
| 2017/0148777 A1 | 5/2017 | Bono et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0263595 A1 | 9/2017 | Kurita et al. |
| 2017/0287874 A1* | 10/2017 | Fang ............... H01L 24/11 |
| 2017/0338214 A1 | 11/2017 | Uzoh et al. |
| 2017/0345761 A1* | 11/2017 | Yu ............... H01L 24/20 |
| 2017/0365580 A1 | 12/2017 | Shih et al. |
| 2017/0365591 A1 | 12/2017 | Chang et al. |
| 2018/0005984 A1 | 1/2018 | Yu et al. |
| 2018/0005992 A1 | 1/2018 | Yu et al. |
| 2018/0006006 A1 | 1/2018 | Kim et al. |
| 2018/0012787 A1 | 1/2018 | Oka et al. |
| 2018/0026008 A1 | 1/2018 | Jeng et al. |
| 2018/0040548 A1* | 2/2018 | Kim ............... H01L 24/09 |
| 2018/0053746 A1 | 2/2018 | Yu et al. |
| 2018/0068958 A1 | 3/2018 | Cho et al. |
| 2018/0068978 A1* | 3/2018 | Jeng ............... H01L 25/50 |
| 2018/0096931 A1 | 4/2018 | Huang et al. |
| 2018/0122774 A1 | 5/2018 | Huang et al. |
| 2018/0130769 A1 | 5/2018 | Tan et al. |
| 2018/0130772 A1 | 5/2018 | Yu et al. |
| 2018/0138101 A1 | 5/2018 | Yu et al. |
| 2018/0151477 A1* | 5/2018 | Yu ............... H01L 24/20 |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |

(56) References Cited

U.S. PATENT DOCUMENTS

| | | |
|---|---|---|
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2018/0342435 A1* | 11/2018 | Yu ............ H01L 24/24 |
| 2018/0366437 A1 | 12/2018 | Chen et al. |
| 2018/0366442 A1 | 12/2018 | Gu et al. |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0103409 A1 | 4/2019 | Xu et al. |
| 2019/0115277 A1 | 4/2019 | Yu et al. |
| 2019/0131277 A1 | 5/2019 | Yang et al. |
| 2019/0181107 A1 | 6/2019 | DeLaCruz et al. |
| 2019/0189607 A1 | 6/2019 | Uzoh et al. |
| 2019/0198407 A1 | 6/2019 | Huang et al. |
| 2019/0198409 A1 | 6/2019 | Katkar et al. |
| 2019/0206791 A1 | 7/2019 | Pietambaram et al. |
| 2019/0221548 A1 | 7/2019 | Huang et al. |
| 2019/0265411 A1 | 8/2019 | Huang et al. |
| 2019/0333550 A1 | 10/2019 | Fisch |
| 2019/0333871 A1 | 10/2019 | Chen et al. |
| 2019/0341306 A1 | 11/2019 | Yu et al. |
| 2019/0348336 A1 | 11/2019 | Katkar et al. |
| 2019/0355706 A1 | 11/2019 | Enquist et al. |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006309 A1 | 1/2020 | Chen et al. |
| 2020/0013637 A1 | 1/2020 | Haba |
| 2020/0013667 A1 | 1/2020 | Leobandung |
| 2020/0013765 A1 | 1/2020 | Fountain, Jr. et al. |
| 2020/0035641 A1 | 1/2020 | Fountain, Jr. et al. |
| 2020/0043853 A1 | 2/2020 | Kim et al. |
| 2020/0058617 A1 | 2/2020 | Wu et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0126906 A1 | 4/2020 | Uzoh et al. |
| 2020/0135684 A1 | 4/2020 | Kim et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0294920 A1 | 9/2020 | Hariri et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395300 A1 | 12/2020 | Xie et al. |
| 2020/0395321 A1 | 12/2020 | Katkar et al. |
| 2020/0403006 A1 | 12/2020 | DeLaCruz et al. |
| 2020/0411483 A1 | 12/2020 | Uzoh et al. |
| 2021/0020577 A1 | 1/2021 | Hu |
| 2021/0028080 A1 | 1/2021 | Pietambaram et al. |
| 2021/0057343 A1 | 2/2021 | Chang et al. |
| 2021/0057352 A1 | 2/2021 | Agarwal et al. |
| 2021/0066219 A1 | 3/2021 | Chen et al. |
| 2021/0082797 A1 | 3/2021 | Lee et al. |
| 2021/0082822 A1 | 3/2021 | Aleksov et al. |
| 2021/0082825 A1 | 3/2021 | Strong et al. |
| 2021/0098411 A1 | 4/2021 | Liff et al. |
| 2021/0098412 A1 | 4/2021 | Haba et al. |
| 2021/0098421 A1 | 4/2021 | Wu et al. |
| 2021/0104487 A1 | 4/2021 | Uzoh et al. |
| 2021/0111125 A1 | 4/2021 | Chen et al. |
| 2021/0118864 A1 | 4/2021 | DeLaCruz et al. |
| 2021/0125933 A1 | 4/2021 | Chen et al. |
| 2021/0125965 A1 | 4/2021 | Lu |
| 2021/0134724 A1 | 5/2021 | Rubin et al. |
| 2021/0143125 A1 | 5/2021 | DeLaCruz et al. |
| 2021/0181510 A1 | 6/2021 | Katkar et al. |
| 2021/0183847 A1 | 6/2021 | Uzoh et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202389 A1 | 7/2021 | Hsieh et al. |
| 2021/0202396 A1 | 7/2021 | Wu et al. |
| 2021/0225780 A1 | 7/2021 | Wu et al. |
| 2021/0242152 A1 | 8/2021 | Fountain, Jr. et al. |
| 2021/0280507 A1 | 9/2021 | Aldrete et al. |
| 2021/0280517 A1 | 9/2021 | May et al. |
| 2021/0280522 A1 | 9/2021 | Liu |
| 2021/0296282 A1 | 9/2021 | Gao et al. |
| 2021/0305122 A1 | 9/2021 | Lai et al. |
| 2021/0305202 A1 | 9/2021 | Uzoh et al. |
| 2021/0335726 A1 | 10/2021 | Wu et al. |
| 2021/0366820 A1 | 11/2021 | Uzoh |
| 2021/0366970 A1 | 11/2021 | Katkar |
| 2021/0375708 A1 | 12/2021 | Kuo et al. |
| 2021/0375737 A1 | 12/2021 | Lin |
| 2021/0384133 A1 | 12/2021 | Ong et al. |
| 2021/0384135 A1 | 12/2021 | Kuan et al. |
| 2021/0391271 A1 | 12/2021 | Hsu et al. |
| 2021/0391272 A1 | 12/2021 | Tsai et al. |
| 2021/0391283 A1 | 12/2021 | Hsu et al. |
| 2021/0391284 A1 | 12/2021 | Hsu et al. |
| 2021/0407941 A1 | 12/2021 | Haba |
| 2022/0005787 A1 | 1/2022 | Han et al. |
| 2022/0020729 A1 | 1/2022 | Gao et al. |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0189941 A1 | 6/2022 | Enquist et al. |
| 2022/0199560 A1 | 6/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0278084 A1 | 9/2022 | Ong et al. |
| 2022/0285303 A1 | 9/2022 | Mirkarimi et al. |
| 2022/0293567 A1 | 9/2022 | Uzoh et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0130580 A1 | 4/2023 | Uzoh et al. |
| 2023/0131849 A1 | 4/2023 | Uzoh et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215739 A1 | 7/2023 | Haba et al. |

(56) References Cited

U.S. PATENT DOCUMENTS

| | | |
|---|---|---|
| 2023/0215836 A1 | 7/2023 | Haba et al. |
| 2023/0245950 A1 | 8/2023 | Haba et al. |
| 2023/0253367 A1 | 8/2023 | Gao et al. |
| 2023/0268300 A1 | 8/2023 | Uzoh et al. |
| 2023/0282610 A1 | 9/2023 | Uzoh et al. |
| 2023/0282634 A1 | 9/2023 | Enquist et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420398 A1 | 12/2023 | Haba |
| 2023/0420399 A1 | 12/2023 | Haba et al. |
| 2024/0006377 A1 | 1/2024 | Wang et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170406 A1 | 5/2024 | Haba |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0234353 A1 | 7/2024 | Haba |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |

FOREIGN PATENT DOCUMENTS

| | | |
|---|---|---|
| EP | 1011133 A1 | 6/2000 |
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2007-294724 A | 11/2007 |
| JP | 2008-130603 A | 6/2008 |
| JP | 2010-034294 A | 2/2010 |
| JP | 2011-171614 | 9/2011 |
| JP | 2013-33786 | 2/2013 |
| JP | 2018-160519 | 10/2018 |
| KR | 10-2001-0104643 | 11/2001 |
| KR | 10-2010-0123755 | 11/2010 |
| KR | 10-2015-0097798 | 8/2015 |
| KR | 10-2018-0054419 | 5/2018 |
| KR | 10-2020-0060670 | 6/2020 |
| KR | 10-2020-0092236 | 8/2020 |
| TW | I464810 B | 12/2014 |
| WO | WO 2005/043584 A2 | 5/2005 |
| WO | WO 2006/100444 A1 | 9/2006 |
| WO | WO 2008/112101 A2 | 9/2008 |
| WO | WO 2010/024678 A1 | 3/2010 |
| WO | WO 2012/004964 A1 | 1/2012 |
| WO | WO 2017/034654 A1 | 3/2017 |
| WO | WO 2017/052652 A1 | 3/2017 |
| WO | WO 2017/151442 A1 | 9/2017 |
| WO | WO 2019/054364 | 3/2019 |
| WO | WO 2022/218624 A1 | 10/2022 |

OTHER PUBLICATIONS

Amirfeiz et al., "Formation of silicon structures by plasma-activated wafer bonding," Journal of The Electrochemical Society, 2000, vol. 147, No. 7, pp. 2693-2698.

Braunisch, H. et al., "High-speed performance of silicon bridge die-to-die interconnects," 2011 IEEE, pp. 95-98.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire, " Electrochemical Society Proceedings vol. 95-7, 1995, pp. 72-77.

Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.

Fukushima, T. et al., "New three-dimensional integration technology using self-assembly technique," International Electron Devices Meeting Dec. 5-7, 2005, IEEE, Dec. 5, 2005, pp. 348-351.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

International Search Report and Written Opinion mailed Apr. 22, 2019 in International Application No. PCT/US2018/064982, 13 pages.

International Search Report and Written Opinion mailed Oct. 25, 2019, issued in International Application No. PCT/US2019/040622, 12 pages.

(56) References Cited

OTHER PUBLICATIONS

Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.

(56) References Cited

OTHER PUBLICATIONS

Uhrmann, T. et al., "Heterogeneous integration by collective die-to-wafer bonding," Chip Scale Review, Nov./Dec. 2018, vol. 22, No. 6, pp. 10-12.

Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Khan et al., "Technologies for printing sensors and electronics over large flexible substrates," IEEE Sensors Journal, Jun. 2015, vol. 15, No. 6, pp. 3164-3185.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part No. "ONSEMI AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

Michailos, Jean, "Future landscape for 3D Integration: from Interposers to 3D High Density," 3d ASIP—Dec. 13-15, 2016, San Francisco Airport, USA, 46 pages.

Yu et al., "Study of 15µm Pitch Solder Microbumpus for 3D IC Integration". In 2009 59th Electronic Components and Technology Conference May 26, 2009 (pp. 6-10).

Anysilicon; "Understanding CoWoS Packaging Technology". (2011) available online at https://anysilicon.com/cowos-pakage/ downloaded Oct. 7, 2024 in 11 pages.

Dillinger, T., "Intel's EMIB Packaging Technology—A Deep Dive". SemiWiki—Open Forum for Semiconductor Professionals; May 3, 2021; 8 pages.

Kao et al., "Large-size multi-layered fan-out RDL multi-chip module packaging". Chip Scale Review Mar./Apr. 2022; 17-25.

* cited by examiner

MULTI-CHIP MODULES FORMED USING WAFER-LEVEL PROCESSING OF A RECONSTITUTED WAFER

RELATED APPLICATIONS

This patent application is a continuation application of and claims benefit or priority to U.S. patent application Ser. No. 16/712,357, filed Dec. 12, 2019, which is a continuation application of U.S. patent application Ser. No. 16/246,863, filed Jan. 14, 2019, which is a divisional application of U.S. patent application Ser. No. 15/624,494, filed Jun. 15, 2017, each of which is incorporated by reference herein in its entirety for all purposes.

FIELD

The following description relates to microelectronic devices. More particularly, the following description relates to multi-chip modules formed using wafer-level processing of a reconstituted wafer.

BACKGROUND

Conventionally forming multi-chip modules has been costly and/or difficult. Accordingly, it would be desirable and useful to provide a multi-chip module formed with less cost and/or less difficulty than in the past.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 2-1 and 2-2 are schematic diagrams of top-down views each depicting an exemplary portion of an in-process reconstituted wafer respectively with and without a usable gap between adjacent upper integrated circuit dies bridged by a lower integrated circuit die.

FIG. 3 is a schematic diagram of a top-down view depicting an exemplary portion of an in-process reconstituted wafer with through-mold vias.

FIGS. 4-1 through 4-6 (collectively "FIG. 4") is a schematic diagram of a progression of cross-sectional side views depicting an exemplary portion of an in-process reconstituted wafer used to provide multi-chip modules ("MCMs") with a mezzanine redistribution layer between adjacent upper integrated circuit dies and a lower integrated circuit die.

FIG. 5 is a schematic diagram depicting an exemplary conductive stack in a portion of a mezzanine redistribution layer of an MCM of FIG. 4.

FIG. 6 is a block diagram of a top-down view depicting an exemplary MCM of FIG. 1 or FIG. 4 having four integrated circuit dies bridged by a same bridge die.

DETAILED DESCRIPTION

Figure 1:
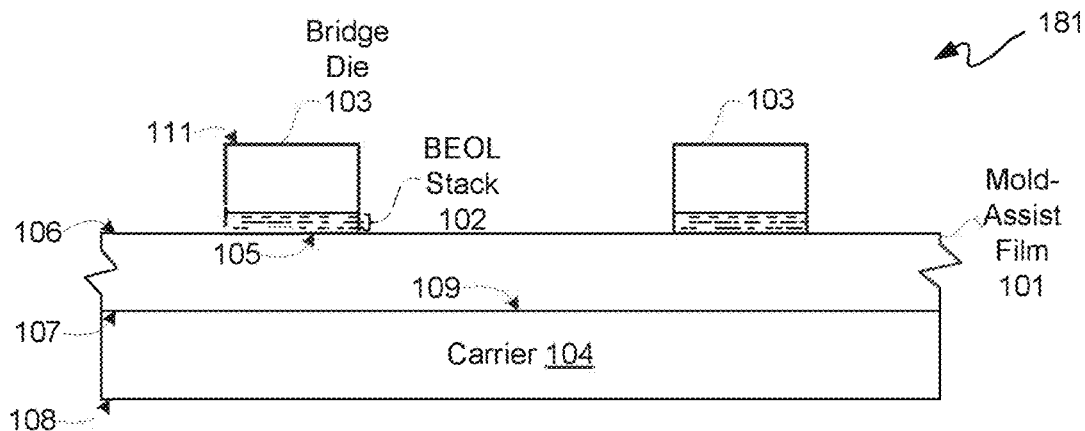
FIGS. 1-1 through 1-14 (collectively "FIG. 1") is a schematic diagram of a progression of cross-sectional side views depicting an exemplary portion of an in-process reconstituted wafer used to provide multi-chip modules ("MCMs")

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

A method relates generally to forming a microelectronic device. In such a method, a first integrated circuit die having first contacts on a die surface thereof is molded in a molding layer to form a reconstituted wafer. The reconstituted wafer has a wafer surface including a layer surface of the molding layer and the die surface of the first integrated circuit die. Conductors are formed extending away from the first contacts. The conductors are directly coupled to the first contacts at bottom ends of the conductors. Second contacts respectively of at least second and third integrated circuit dies are coupled to top ends of the conductors opposite the bottom ends thereof. The second contacts on die surfaces of the at least second and third integrated circuit dies overlap the first contacts on the die surface of the first integrated circuit die. The at least second and third integrated circuit dies are respectively coupled to the top ends of the conductors in part for aligning of the at least second and third integrated circuit dies to the first integrated circuit die.

Another method relates generally to forming a microelectronic device. In such a method, a first integrated circuit die having first contacts on a die surface thereof is molded in a molding layer to form a reconstituted wafer. The reconstituted wafer has a wafer surface including a layer surface of the molding layer and the die surface of the first integrated circuit die. A redistribution layer is formed on the wafer surface of the reconstituted wafer. The redistribution layer includes electrically conductive layers and dielectric layers to provide conductive routing and conductors. The conductors extend away from the die surface of the first integrated circuit die and are respectively coupled to the first contacts at bottom ends of the conductors. At least second and third integrated circuit dies respectively having second contacts on die surfaces thereof are obtained. A first portion of the second contacts are interconnected to top ends of the conductors opposite the bottom ends thereof in part for aligning of the at least second and third integrated circuit dies to the first integrated circuit die. A second portion of the second contacts are interconnected to the conductive routing.

An apparatus relates generally to a microelectronic device. In such an apparatus, a first integrated circuit die having first contacts on a die surface thereof is in a molding layer of a reconstituted wafer. The reconstituted wafer has a wafer surface including a layer surface of the molding layer and the die surface of the first integrated circuit die. A redistribution layer is on the wafer surface. The redistribution layer includes electrically conductive layers and dielectric layers to provide conductive routing and conductors. The conductors extend away from the die surface of the first integrated circuit die and are respectively coupled to the first contacts at bottom ends of the conductors. At least second and third integrated circuit dies respectively having second contacts on die surfaces thereof are interconnected to the first integrated circuit die and the redistribution layer. A first portion of the second contacts are interconnected to top ends of the conductors opposite the bottom ends thereof in part for alignment of the at least second and third integrated circuit dies to the first integrated circuit die. A second portion of the second contacts are interconnected to one another through the conductive routing.

Other features will be recognized from consideration of the remainder of the Detailed Description and the Claims, which follow.

FIGS. 1-1 through 1-14 is a schematic diagram of a progression of cross-sectional side views depicting an exemplary portion of an in-process reconstituted wafer 100. Reconstituted wafer 100 may be for providing microelectronic devices, including without limitation multi-chip modules ("MCMs"). With simultaneous reference to FIGS. 1-1 through 1-14, formation of a reconstituted wafer 100 is further described.

A mold assist film 101 may be placed on an upper surface of a carrier 104. Carrier 104 may be a separate platform or a mold form. Mold assist film 101 may be a tape or other form of mold assist film. Use of terms such as "upper" and "lower" or other directional terms is made with respect to the reference frame of the figures and is not meant to be limiting with respect to potential alternative orientations, such as in further assemblies or as used in various systems.

A lower surface 107 of mold assist film 101 may be placed on an upper surface 109 of carrier 104 or other form of support platform. Along those lines, lower surface 107 may be indexed to upper surface 109 covering an area. A lower surface 108 of carrier 104 may be for positioning in an injection or other molding machine. Thus, surfaces 107 and 109 may generally be coplanar to one another.

Upper surface 109 of carrier 104 may be at least substantially flat in accordance with having an upper surface 106 of mold assist film 101 being substantially flat. However, lower surfaces 105 of bridge dies 103, which may be at least substantially coplanar with one another, may be depressed into upper surface 106 of mold assist film 101. Lower surfaces 105 of bridge dies 103 are placed on upper surface 106 of mold assist film 101. Bridge dies 103, which may include active or passive integrated circuit ("IC") dies or a combination thereof, may be positioned spaced apart from one another on an upper surface 106 of mold assist film 101.

An upper surface 111 of bridge die 103 may generally be associated with what is referred to as a "front side" of an IC die. Along those lines, a front-side of an in-process IC semiconductor wafer may be used for forming what is referred to as front-end-of-line ("FEOL") structures of IC dies. Generally, FEOL structures may include shallow trench isolations ("STI"), transistor gates, transistor source/drain regions, transistor gate dielectrics, a contact etch stop layer ("CESL"), a pre-metallization dielectric or pre-metal dielectric ("PMD"), and contact plugs, among other FEOL structures.

A lower surface 105 of bridge die 103 may generally be associated with what is referred to as a "backside" of an IC die. Along those lines, a backside of an in-process IC semiconductor wafer may be used for forming what is referred to as back-end-of-line ("BEOL") structures. Generally, BEOL structures may include one or more inter-level dielectrics ("ILDs") and one or more levels of metallization ("M"). Each ILD may be composed of one or more dielectric layers. Additionally, metal from a metallization level may extend through one or more ILDs, as is known. Furthermore, each level of metallization may be composed of one or more metal layers. A passivation level may be formed on a last metallization layer. Such passivation level may include one or more dielectric layers, and further may include an antireflective coating ("ARC").

For bridge die 103 a passive die, there may not be any FEOL structures, and thus such a passive bridge die 103 may include only BEOL structures. Along those lines, for purposes of clarity by way of example and not limitation, it shall be assumed that bridge die 103 is a passive die, even though in other examples bridge die 103 may be an active die.

A BEOL stack 102 of bridge die 103 may be in contact with an upper surface 106 of mold assist film 101 along a lower surface 105 of such BEOL stack 102, which is likewise a lower surface 105 of bridge die 103. Accordingly, it should be understood that bridge die 103 has be diced or singulated from an IC semiconductor wafer. Accordingly, for the following description, reference to wafer-level processing ("WLP") refers to processing of or at a reconstituted wafer 100, as described below in additional detail. Moreover, even though two instances of a bridge die 103 are illustratively depicted, a reconstituted wafer 100 may have many more than two instances of a bridge die 103.

Thus, generally at operation 181, bridge dies 103 are placed backside down on an upper surface 106 of a mold-assist film 101, where mold-assist film 101 has previously been adhered to an upper surface 109 of a carrier 104. Die surfaces 105 of corresponding bridge dies 103 may be adhered to an upper surface 106 of a mold release film 101.

At operation 182, a molding layer 114 may be deposited, injected or otherwise formed over upper surfaces 111 and along sidewall surfaces 113 of bridge dies 103. Molding one or more bridge dies in a molding layer 114 may be used to form a reconstituted wafer 100 for subsequent WLP. Forming molding layer 114 over and between bridge dies 103 and onto surface 106 of mold release film 101 is for providing a reconstituted wafer 100, as such molding layer 114 and bridge dies 103 combination provides at least a portion of a reconstituted wafer 100.

At operation 183, carrier 104 and mold assist film 101 may be removed from reconstituted wafer 100, and reconstituted wafer 100 may be flipped or otherwise inverted to have upper surfaces 105 and lower surfaces 111 of bridge dies. Bridge dies 103 may include fine-pitch contacts 116. Examples of fine pitch contacts include micro pads, micro bumps and the like. Conventionally, fine pitch contacts 116 are formed as BEOL structures during formation of bridge dies 103, which may be formed on a same IC semiconductor wafer. Fine pitch contacts 116 may be formed as a last metal deposition of a BEOL stack, so fine pitch contacts 116 may be on upper surfaces 105 of bridge dies 103.

By fine pitch, it is generally meant having or capable of having pitches of less than approximately 60 microns. By approximately, it is generally meant within 10 percent of the ascribed value. Such fine pitches may require less than approximately a two-micron line space for conductors 121. For purposes of clarity by way of example and not limitation, it shall be assumed that fine pitch contacts 116 refers to microbumps.

Upper surfaces 105 may protrude slightly higher than upper surface 115 after molding. In other words, an upper layer surface 115 of molding layer 114 is at a lower level with respect to upper die surfaces 105 of bridge dies 105. Along those lines, upper surfaces 105 may appear as islands encircled by molding material of molding layer 114.

In another implementation, fine pitch contacts 116 may be Direct Bond Interconnect ("DBI") contacts, where such DBI contacts 116 may include DBI pads and DBI posts. DBI contacts may have a pitch in a range of approximately 1 to 100 microns. Along those lines, prior to forming DBI contacts 116, an upper surface 115 of molding layer 114 and upper surfaces 105 of bridge dies 103 may be polished, lapped, ground, or otherwise surfaced by a surfacing operation 117, to have upper surfaces 105 and 115 at least sufficiently coplanar for WLP for DBI. For this surfacing operation 117, optionally another carrier (not shown) may be used for supporting reconstituted wafer 100. In this example, DBI contacts 116 may be formed after surfacing operation 117.

At operation 184, a resist or other pattern forming layer 119 may be deposited, spun or otherwise formed on an upper surface 118 of reconstituted wafer 100, namely on upper surfaces 105 and upper surface 115. For purposes of clarity, upper surfaces 105 and upper surface 115 in combination are referred singly as a wafer surface 118 of reconstituted wafer 100. In other words, reconstituted wafer 100 has a wafer surface 118 which includes a layer surface 115 of molding layer 114 and at least one die surface 105 of at least one bridge die 103.

At operation 185, resist layer 119 is patterned to etch resist-through holes from an upper surface 122 of resist layer 119 down to contacts 116 of bridge dies 103 along upper surfaces 105. However, in another example, patterning of resist layer 119 may be avoided by using a direct write operation, such as laser drilling for example. After forming resist-through holes, resist-through holes may then have a conductive material deposited, plated or otherwise formed or placed in such holes to form conductors 121, such as conductive posts 121 for example, at operation 185. Though conductors 121 are depicted with solid black lines, conductors 121 may be provided with fully or partially filled holes.

Bottom ends 125 of conductors 121 may be directly coupled to contacts 116. Shafts 124 of conductors 121 may extend away from contacts 116 and thus extend away from an associated upper surface 105. Conductors 121 may be conductive posts or pillars in this example.

In this example, such conductive posts 121 may be at least substantially perpendicular to upper surface 105 to provide at least approximately a shortest conductive path for interconnection of upper dies to top ends of such conductive posts 121. Along those lines, conductive posts 121 directly coupled to fine pitch contacts 116 may be for high-speed and/or broadband signaling applications. Shafts 124 may not be exactly vertical, and thus top ends 123 and bottom ends 125 may be opposite one another, though not directly opposite one another for a shortest path implementation. For purposes of clarity by way of example and not limitation, it shall be assumed that conductive posts 121 are perpendicular to upper surface 105 such that top ends 123 of conductors 121 are directly opposite bottom ends 125 for a vertical shortest path orientation.

Resist-through holes may have therein copper, aluminum, eutectic material (e.g., solder) or other conductive material to provide conductors 121. A surfacing operation 117 may be performed on an upper surface 122 of resist layer 119 to remove excess metal and to at least locally planarize top ends 123 of conductors 121. By locally planarize, it is generally meant that top ends 123 of conductors 121 of a same bridge die 103 are substantially planar with respect to one another. This is not meant to preclude planarity of top ends 123 of conductors 121 for two or more bridge dies 103; rather, because upper IC dies 126 and 127 are indexed to top ends 123 of conductors 121 per bridge die 103, planarity between bridge dies 103 may not be needed. In other words, top ends 123 of conductors 121 collectively form an alignment feature 120 of a bridge die 103 for indexing two or more other IC dies 126 and 127 to such alignment feature 120 of such same bridge die 103.

In a DBI implementation, resist layer 119 may be a DBI pad layer, and resist-through holes may be for forming DBI posts, same as conductive posts 121, followed by other known operations for forming lower DBI contacts 121. Such lower DBI contacts 121 may collectively form an alignment feature 120 of a bridge die 103.

At operation 186, sets of fine pitch contacts 130 and 131 respectively of IC dies 126 and 127 may be directly coupled to corresponding sets of top ends 123 of an alignment feature 120 of a bridge die 103. Fine pitch contacts 130 and 131 of IC dies 126 and 127 may be formed as part of corresponding BEOL stacks 102 of such IC dies 126 and 127, and may be the same as contacts 116, such as microbumps or micro pads for example. Alignment feature 120 is in part for aligning IC dies 126 and 127 to bridge die 103 and in part for providing electrically conductive interconnects between bridge die 103 and IC dies 126 and 127.

Additionally or optionally, contacts 140 and 141 of IC dies 126 and 127 may be formed on corresponding same surfaces 129 as fine pitch contacts 130 and 131, respectively. Contacts 140 and 141 of IC dies 126 and 127 may likewise be formed as part of corresponding BEOL stacks 102 of such IC dies 126 and 127. Contacts 140 and 141 may be larger microbumps or micro pads than contacts 116 for example. Pitch of contacts 140 and 141 depends on die thickness of bridge die 103. For example, for bridge die 103 thinned down to be in a range of approximately 5 to 10 microns, through-mold via ("TMV") pitch may be as narrow as approximately 10 microns for direct writing of through-mold vias to such contacts 140 and 141. However, for a bridge die 103 having a thickness of approximately 200 microns, TMV pitch may be approximately 300 microns.

For conductive posts 121, resist layer 119 may be removed. For contacts 130 and 131 being upper DBI contacts, such DBI contacts may be formed in a known manner for interconnection with lower DBI contacts 116.

Each set of fine pitch contacts 116, 130, and 131 includes at least a 3-by-3 array. Thus, one array set of at least 3-by-3 fine pitch contacts 116 corresponds to an array set of at least 3-by-3 fine pitch contacts 130, and another array set of at least 3-by-3 fine pitch contacts 116 corresponds to an array set of at least 3-by-3 fine pitch contacts 131.

Bridge die 103 is in a face up orientation, and IC dies 126 and 127 coupled to such bridge die 103 are both in a face down orientation. In this example, a gap 128 may be between facing sidewall surfaces of IC dies 126 and 127.

Contacts 130 and 131 on corresponding lower die surfaces 129 of IC dies 126 and 127 overlap corresponding contacts 116 on an upper die surface 105 of bridge die 103. For a gap 128, top ends 123 may be available for through-mold vias for interconnection to bridge die 103, as described below in additional detail with reference to FIGS. 2-1 and 2-2.

Figures 1, 2:
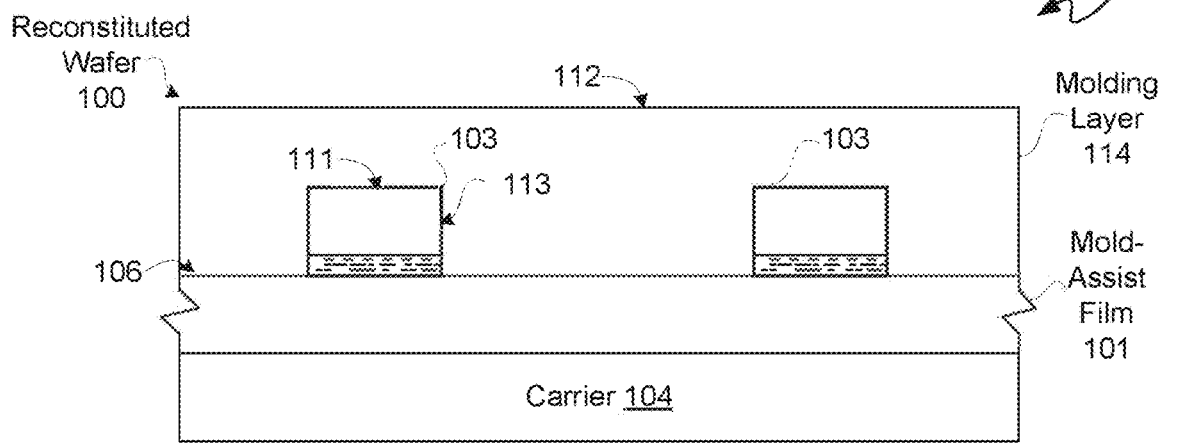

FIGS. 2-1 and 2-2 are schematic diagrams of top-down views each depicting an exemplary portion of an in-process reconstituted wafer 100. With reference to FIG. 2-1, little to no gap 128 is present between facing sidewall surfaces of upper IC dies 126 and 127. Respective portions of downwardly facing surfaces of upper IC dies 126 and 127 overlap corresponding portions of an upwardly facing surface of bridge die 103. However, FIG. 2-2 shows a usable gap 128 between facing sidewall surfaces of IC dies 126 and 127, and top ends 123 of conductive posts 121 may optionally be available for interconnection with through-mold vias, as described below in additional detail.

Returning to FIGS. 1-1 through 1-14, resist layer 119 may be removed in whole or in part, or left in place as a fill layer. Generally, resist layer 119 will be removed and not used as a fill layer. Along those lines, at operation 187, resist layer 119 may be removed, and an underfill or other fill layer 132 may be injected to be between lower die surfaces 129 of upper IC dies 126 and 127 and corresponding overlapped portions of upper surface 118 of reconstituted wafer 100. Such underfill layer 132 may be used for fine pitch contacts 116, 130 and 131 all being microbumps. For fine pitch contacts 116, 130 and 131 all being DBI contacts, material for DBI pads may effectively provide an underfill layer 132.

Though only two upper dies 126 and 127 are coupled to bridge die 103 in the example, in another implementation more than two upper dies may be coupled to a bridge die. However, at least IC dies 126 and 127 may be respectively coupled to respective sets of top ends 123 of conductors 121 in part for electrical conductivity and in part for mechanical alignment of at least such upper IC dies to such bridge die. Along those lines, such mechanical alignment may be for at least substantial coplanarity. In other words, for top ends 123 being in a plane coplanar or parallel with an upwardly facing surface 105 of a bridge die 103, downwardly facing surfaces 129 of upper IC dies 126 and 127 directly coupled to such top ends 123 may likewise be substantially coplanar with upwardly facing surface 105. In short, alignment feature 120 is for having upper IC dies aligned to a bridge die for coplanarity to provide a low-profile MCM.

At operation 188, an optional molding layer 133, namely an over mold layer 133, may be molded or otherwise formed over and between at least IC dies 126 and 127 and onto a remaining temporarily exposed portion of upper wafer surface 118 of reconstituted wafer 100. Over mold layer 133 may be used to unitize reconstituted wafer 100 with bridge die 103, an optional fill layer 132, and at least IC dies 126 and 127 for having an in-process unitized MCM 150 in such reconstituted wafer 100.

At optional operation 189, an optional surfacing operation 117 may be performed. Surfacing operation 117 may be from an upper layer surface 134 of molding layer 114 opposite layer surface 115 or 118 thereof toward die surfaces 111 of bridge dies 103 opposite die surfaces 105 thereof. Surfacing operation 117 may be used for WLP thinning of reconstituted wafer 100, as generally indicated with dashed lines. Along those lines, surfacing operation 117 may be configured to stop on die surfaces 111, or may be configured to remove portions substrates of bridge dies 103 from die surfaces 111 downward, as generally indicated with dashed lines.

Alternatively with reference to optional operation 189, an optional surfacing operation 117 may be performed at 189A. Surfacing operation 117 at operation 189A may likewise be from an upper layer surface 134 of molding layer 114 opposite layer surface 115 or 118 thereof toward die surfaces 111 of bridge dies 103 opposite die surfaces 105 thereof. Again, such surfacing operation 117 may be used for WLP thinning of reconstituted wafer 100, as generally indicated with dashed lines.

However, surfacing operation 117 of alternative optional operation 189A may be configured to stop on interior die surfaces 111 of corresponding BEOL stacks 102 of bridge dies 103, as generally indicated with dashed lines. Thus, after this thinning operation 189A, only BEOL stacks 102 may remain for bridge dies 103, such as for bridge dies 103 being passive dies. For purposes of clarity by way of example and not limitation, it shall be assumed that a surfacing operation 117 at operation 189 is used for a surfacing or thinning passed die surfaces 111 implementation to provide partially thinned substrates of bridge dies 103.

At optional operation 190, an optional surfacing operation 117 may be performed. Surfacing operation 117 may be from an upper layer surface 135 of over mold layer 133 opposite layer surface 115 or 118 thereof toward die surfaces 136 of upper active IC dies 126 and 127 opposite die surfaces 129 thereof. Surfacing operation 117 may be used for WLP thinning of reconstituted wafer 100, as generally indicated with dashed lines. Along those lines, surfacing operation 117 may be configured to stop on die surfaces 136, or may be configured to remove portions of substrates of upper active IC dies 126 and 127 from die surfaces 136 downward, as generally indicated with dashed lines. Again, for purposes of clarity by way of example and not limitation, it shall be assumed that a surfacing operation 117 at operation 190 is used for a thinning passed die surfaces 136 implementation to provide partially thinned substrates of upper active IC dies 126 and 127.

At operation 191, a compliant layer 142, such as a polyimide layer for example, may be spun, printed, deposited, or otherwise formed on layer surface 134 of molding layer 114. Further at operation 191, through-mold vias 143 extending through the compliant layer 142 and molding layer 114 to sets of contacts 140 and 141 respectively on die surfaces 129 of at least IC dies 126 and 127. Contacts 140 and 141 have a coarser or wider pitch than contacts 130 and 131. Through-mold vias 143 may be formed by a direct-write laser drilling operation followed by plating with a conductive material or other process for forming through-mold vias.

Through-mold vias 143 may generally consist of a metallic or other conductive material generally filling a void in an opening formed in a molding layer to provide through-mold vias 143. In various examples, a through-mold via 143 may generally consist of copper or a copper alloy. However, a through-mold via 143 may additionally or alternatively include one or more other conductive materials such as tantalum, nickel, titanium, molybdenum, tungsten, aluminum, gold, or silver, including various alloys or compounds of one or more of the these materials, and the like. A through-mold via 143 may include non-metallic additives to control various environmental or operational parameters of a through-mold via 143.

Optionally, holes for through-mold vias 143 may be formed followed by deposition of a conductive material matrix, such as for example a solder paste, in such holes to form through-mold vias 143. Optionally, hole for through-mold vias 143 may be formed followed by respectively wire bonding, such as ball bonding, wire bond wires to contacts 140 and 141 to provide bond via arrays for through-mold vias 143. However, for purposes of clarity by way of example and not limitation, it shall be assumed that through-mold vias 143 are formed by plating laser drilled via holes.

Figures 1, 2, 3:
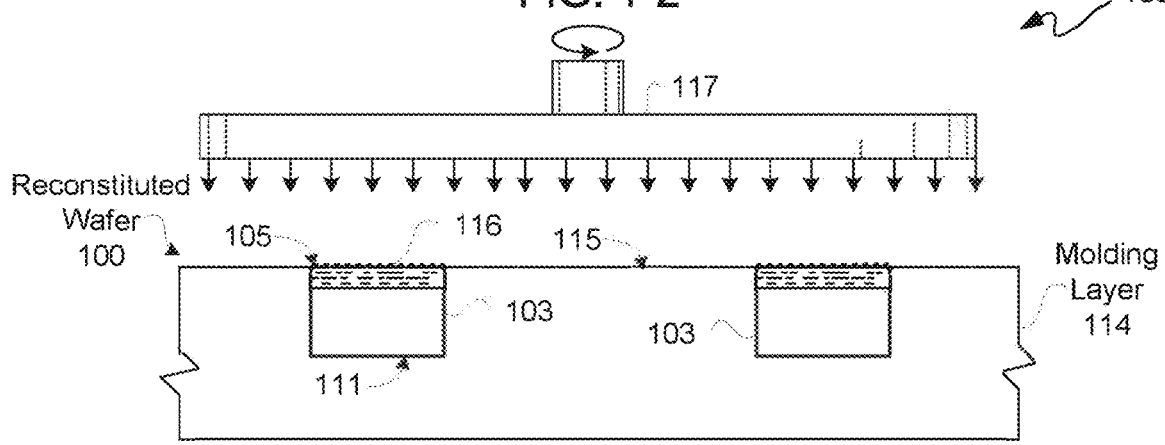
Figures 1, 2, 3, 4:
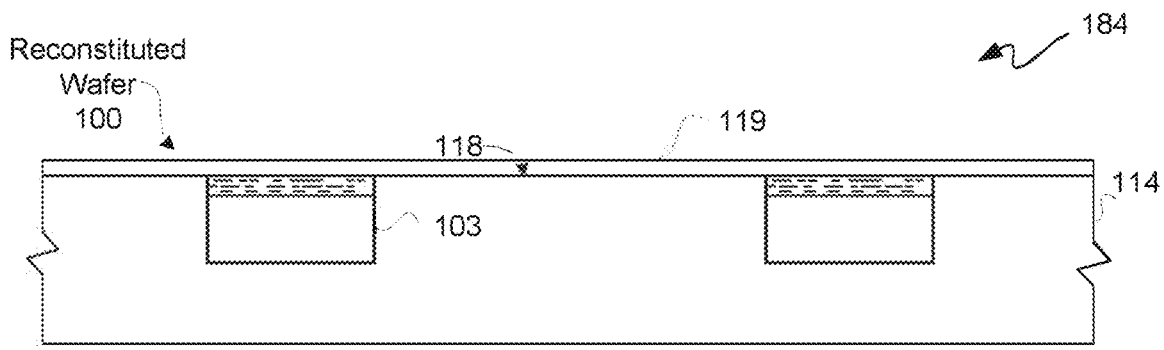

With additional reference to FIG. 3, where there is shown a schematic diagram of a top-down view depicting an exemplary portion of an in-process reconstituted wafer 100, operation at 191 is further described. Optionally at operation 191, reconstituted wafer 100 may be flipped over to form through-mold vias 144 similar to through-mold vias 143. Along those lines, for a usable gap 128 between facing sidewall surfaces of IC dies 126 and 127, top ends of through-mold vias 144 may optionally be available for interconnection to contacts 116. Optionally through-mold vias 144 may be formed through molding layer 133 from upper layer surface 135 down to contacts 116 of bridge die 103 in a gap 128 between IC dies 126 and 127. However, for purposes of clarity by way of example and not limitation, it shall be assumed that through-mold vias 144 are not formed.

With continued reference to FIGS. 1-1 through 1-14, at operation 192, an interconnect structure may be formed or attached. For example, a Redistribution Layer or RDL 145 may be formed for interconnect structure. However, in another implementation, a package substrate may be attached as an interconnect structure. For purposes of clarity and not limitation, it shall be assumed that an RDL 145 is used.

Such RDL 145 may be formed on an upper surface 146 of compliant layer 142. RDL 145 may include at least one substantially electrically conductive layer 147, such as a metal layer 147 for example, and at least one substantially non-electrically conductive layer 148, such as a dielectric layer 148. However, generally RDL 145 includes more than one metal layer 147 and more than one dielectric layer 148.

A metal layer of metal layers 147 of RDL 145 may be coupled for electrical conductivity to through-mold vias 143. Such one or more metal layers 147 may include contact pads upon which solder balls 149 may be formed for electrical conductivity to through-mold vias 143. Solder balls 149 and thus contact pads therefor may consume more area than upper ends of through-mold vias 143, and so RDL 145 may be used to provide an electrical fan-in interface to contacts 140 and 141 respectively of IC dies 126 and 127. One or more dielectric layers 148 may be formed with a laminate process, and conductive routing may be bumped with solder balls 149 for subsequent attachment to a printed circuit board ("PCB") or a package substrate or other larger scale platform as compared with MCMs 150 of reconstituted wafer 100.

Conventionally, an RDL may include: a dielectric layer, such as a polyimide layer for example; a metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

At operation 193, MCMs 150 may be singulated from a reconstituted wafer 100. Such MCMs may provide a stand-alone "2.5D" module formed using WLP. In an example, bridge die 103 is a passive bridge die having minimum pitch routing for interconnecting at least IC dies 126 and 127 to one another for high-speed and/or high bandwidth communication between such IC dies. Though a passive bridge die 103 was described above, bridge die 103 need not be a passive die. In an implementation, bridge die 103 may be a memory die, and IC dies 126 and 127 may share memory of bridge die, where bridge die 103 includes an arbiter for such sharing of memory.

FIGS. 4-1 through 4-6 is a schematic diagram of a progression of cross-sectional side views depicting an exemplary portion of an in-process reconstituted wafer 200. Reconstituted wafer 200 may be for providing microelectronic devices, including without limitation MCMs. Operations 181 and 182 described with reference to FIGS. 1-1 and 1-2, respectively, as well as other above description are the same for both reconstituted wafers 100 and 200, and so such description is generally not repeated for purposes of clarity with respect to reconstituted wafer 200 of FIGS. 4-1 through 4-6. With simultaneous reference to FIGS. 1-1 through 1-12 and 4-1 through 4-6, formation of a reconstituted wafer 200 is further described.

At operation 281, an RDL 201 may be formed on die surfaces 105 and molding layer surface 115 respectively of bridge dies 103 and molding layer 114 for forming at least a portion of a reconstituted wafer 200. In contrast to operation 183, an optional surfacing operation 117 may be avoided at operation 281, as for example a polyimide dielectric of RDL 201 may effectively fill differences between surfaces 105 and 115 of wafer surface 118 of reconstituted wafer 200, which is generally indicated as a lower surface 218 of RDL 201.

Such RDL 201 may be formed on an upper wafer surface 118 and may include at least one mainly electrically conductive layer, such as for example a metal layer 202, and at least one substantially non-electrically conductive layer 203, such as for example a dielectric layer 203. However, generally RDL 201 includes more than one metal layer 202 and more than one dielectric layer 203. Along those lines, metal layers 202 may be used to provide lengthwise routing (e.g., metal traces) and crosswise routing (e.g., metal vias), namely conductive routing 205, interconnected to one another. Conductive routing 205 may generally extend across an MCM 250 in part for interconnecting IC dies 126 and 127 to one another and in part for interconnection to through-mold vias. For purposes of clarity and not limitation, it shall be assumed that conductive routing 205 of RDL 201 includes upper contacts at upper surface 209 of RDL 201 and lower contacts at an opposite lower surface 218 of RDL 201.

In addition to conductive routing 205, conductors 204, such as conductive stacks 204 for example, may be formed in RDL 201. Conductive stacks 204 may be formed from one or more successive metal layers 202 stacked one on top of another. While conductive routing 205 may be located in a region of RDL 201 having conductive stacks 204, same is not illustratively depicted for purposes of more clearly showing conductive stacks 204. Moreover, conductive routing 205 need not be formed in regions between MCMs 250 to be singulated from one another.

Bottom ends of conductors 204 may be directly coupled to contacts 116 of bridge dies 103. Stacked sections of conductors 204 may extend away from contacts 116 and thus extend away from an associated upper surface 105 of a bridge die 103.

In another implementation, conductors 204 may be through-RDL conductive vias. Along those lines, an RDL 201 may be formed followed by forming through holes in such RDL 201 down to contacts 116, and such holes may be plated with metal or otherwise formed, as previously described. For purposes of clarity by way of example and not limitation, it shall be assumed that conductors 204 are conductive stacks 204.

Figures 1, 2, 3, 4, 5:
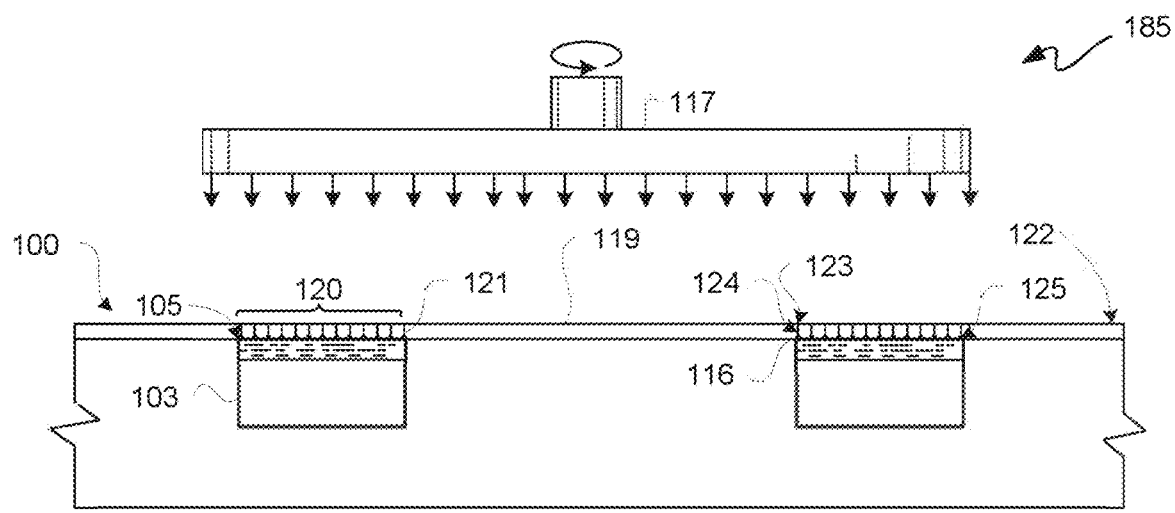

Along those lines, with additional reference to FIG. 5, where there is shown a schematic diagram depicting an exemplary conductive stack 204 in a portion of an RDL 201, conductive stacks 204 may be progressively formed in RDL 201. In this example of a portion of RDL 201, there are four dielectric layers 203 stacked one on top of another; however, in another example there may be fewer or more than four dielectric layers 203.

Each patterned dielectric layer 203 of a succession includes a metal layer 202 for forming a conductive via 206. Conductive vias 206 may be aligned to one another for forming a conductive stack 204, where each such conductive via 206 may provide a section of conductive stack 204.

In an example, such conductors 204 may in effect be at least substantially perpendicular to upper surface 105 to provide at least approximately a shortest conductive path for interconnection of upper dies to top ends of such conductors 204. Along those lines, bottom ends 208 of conductors 204 may be directly coupled to fine pitch contacts 116 for high-speed and/or broadband signaling applications.

Conductive vias 206 may not be exactly vertical, and thus top ends 207 and bottom ends 208 may be opposite one another, though not directly opposite one another for a shortest path implementation. For purposes of clarity by way of example and not limitation, it shall be assumed that conductors 204 are perpendicular to upper surface 105 such that top ends 207 of conductors 204 are directly opposite bottom ends 208 for a vertical shortest path orientation. Conductive vias 206 may have therein copper, aluminum, eutectic material (e.g., solder) or other conductive material to provide conductors 204.

An optional surfacing operation 117 may be performed on an upper surface 209 of RDL 201 to remove excess metal and to at least locally planarize top ends 207 of conductors 204. By locally planarize, it is generally meant that top ends 207 of conductors 204 of a same bridge die 103 are substantially planar with respect to one another. Again, this is not meant to preclude planarity of top ends 207 of conductors 204 for two or more bridge dies 103; rather, because upper IC dies 126 and 127 are indexed to top ends 207 of conductors 204 per bridge die 103, planarity between bridge dies 103 may not be needed. In other words, top ends 207 of conductors 204 collectively form an alignment feature 220 of a bridge die 103 for indexing two or more other IC dies 126 and 127 to such alignment feature 220 of such same bridge die 103, where alignment feature 220 is similar to previously described alignment feature 120. Again, alignment feature 220 is in part for aligning IC dies 126 and 127 to bridge die 103 and in part for providing electrically conductive interconnects between bridge die 103 and IC dies 126 and 127.

At operation 282, sets of fine pitch contacts 130 and 131 respectively of IC dies 126 and 127 may be directly coupled to corresponding sets of top ends 207 of an alignment feature 220 of a bridge die 103. Fine pitch contacts 130 and 131 of IC dies 126 and 127 may be formed as part of corresponding BEOL stacks 102 of such IC dies 126 and 127, and may be the same as contacts 116, such as microbumps or micro pads for example. However, because an RDL 201 is formed, fine pitch contacts 130 and 131 may be used across lower die surfaces 129 instead of having contacts 140 and 141 of IC dies 126 and 127.

Again, bridge die 103 is in a face up orientation, namely a backside surface thereof is facing in an upward direction, and IC dies 126 and 127 coupled to such bridge die 103 are both in a face down orientation, namely respective backside surfaces thereof are facing in a downward direction. In this example, a gap 128 may be between facing sidewall surfaces of IC dies 126 and 127. Contacts 130 and 131 on corresponding lower die surfaces 129 of IC dies 126 and 127 overlap corresponding contacts 116 on an upper die surface 105 of bridge die 103 with respect to conductors 204. For a gap 128, top ends 207 of conductors 204 may be available for through-mold vias in an over mold layer for interconnection to bridge die 103, as previously described though not shown again for purposes of clarity and not limitation.

Optionally, operation 282 may include an optional etch 219, namely operation 282A. Along those lines, exposed dielectric material of RDL 201 between IC dies 126 and 127, for example, may be removed by etch 219. Etch 219 may be an anisotropic etch selective to such dielectric material for such removal. Etch 219 may be used to reveal a portion of upper wafer surface 115 associated with molding layer 114.

At operation 283, a molding layer 133, namely an over mold layer 133, may be molded or otherwise formed over and in one or more spaces between at least IC dies 126 and 127 and onto a remaining temporarily exposed upper surface portion of RDL 201. Such molding layer 133 may seal to sidewall surfaces of IC dies 126 and 127. Over mold layer 133 may be used to unitize reconstituted wafer 200 with bridge die 103, RDL 201, and at least IC dies 126 and 127 for having an in-process unitized MCM 250 in such reconstituted wafer 200.

For an optional etch 219 used, an alternative operation 283A may be used. Along those lines, an over mold layer may be formed, as previously described, except such over mold layer 133 may seal to a remaining temporarily exposed upper wafer surface 115 portion of molding layer 114 and sidewall surfaces of RDL 201. Thus, a mold layer-to-mold layer seal may be formed by having molding layers 114 and 133 abut along a portion of upper wafer surface 115.

In-process reconstituted wafer 200 may be further processed such as for example as described above with reference to operations at 189, 189A, and/or 190. Accordingly, such description is not repeated. Moreover, for purposes of clarity by way of example, it shall be assumed that reconstituted wafer 200 is thinned or surfaced down, and so operation 284 is substantially similar to operation 191.

Along those lines, at operation 284, a compliant layer 142 and through-mold vias 143 may be formed through compliant layer 142 and molding layer 114 as previously described and thus not repeated. However, an underfill layer may be omitted in this configuration with an RDL 201, and so bottom ends of through-mold vias 143 may be coupled for electrical conductivity to contacts, such as contact pads for example, of a metal layer 202 of RDL 201.

Previously described operations at 192 and 193 may be used on reconstituted wafer 200 to provide MCMs 250. Accordingly, repetitious description of operations at 192 and 193 is avoided for purposes of clarity and not limitation.

With the above-description borne in mind, it should be appreciated that by over molding after attachment of at least IC dies 126 and 127, shifting of die in an MCM, such as for fine pitch microbumps for example, is less likely. Furthermore, because IC dies 126 and 127 are aligned or indexed to a bridge die 103, coplanarity of IC dies 126 and 127 to one another need not be as difficult a requirement to manufacture of an MCM. In other words, if IC dies 126 and 127 are molded first to form a reconstituted wafer platform for subsequent coupling of a corresponding bridge die 103, then such IC dies 126 and 127 would generally be required to be at least substantially coplanar to one another for attachment of such bridge die 103. However, with a bridge die first molding flow, such requirement for coplanarity as between subsequently attached and molded IC dies 126 and 127 is at least substantially relaxed if not avoided in comparison to a non-bridge die first molding flow.

Figures 1, 2, 3, 4, 5, 6:
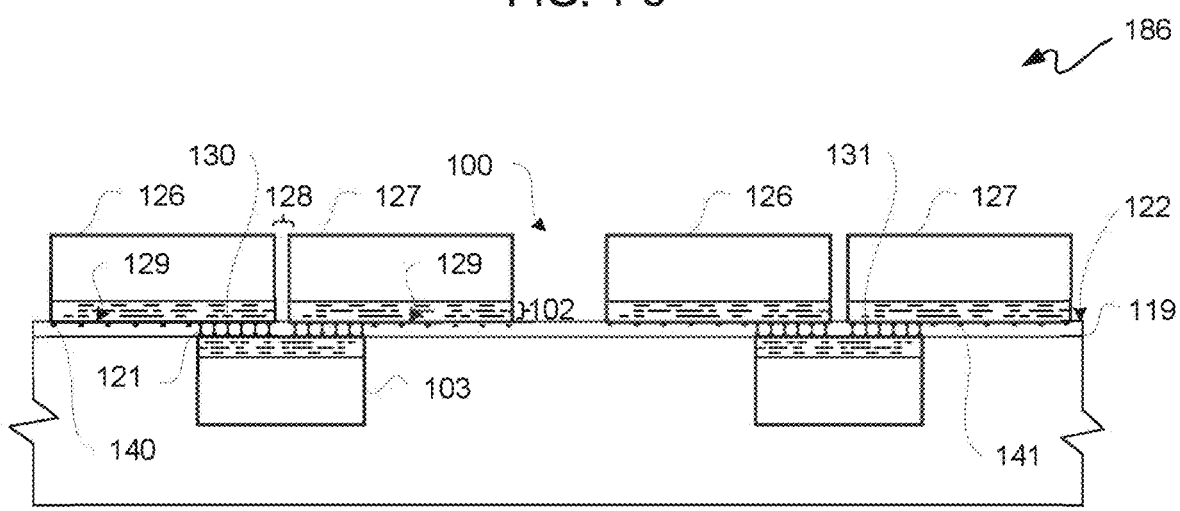
Figures 1, 2, 3, 4, 5, 6, 7:
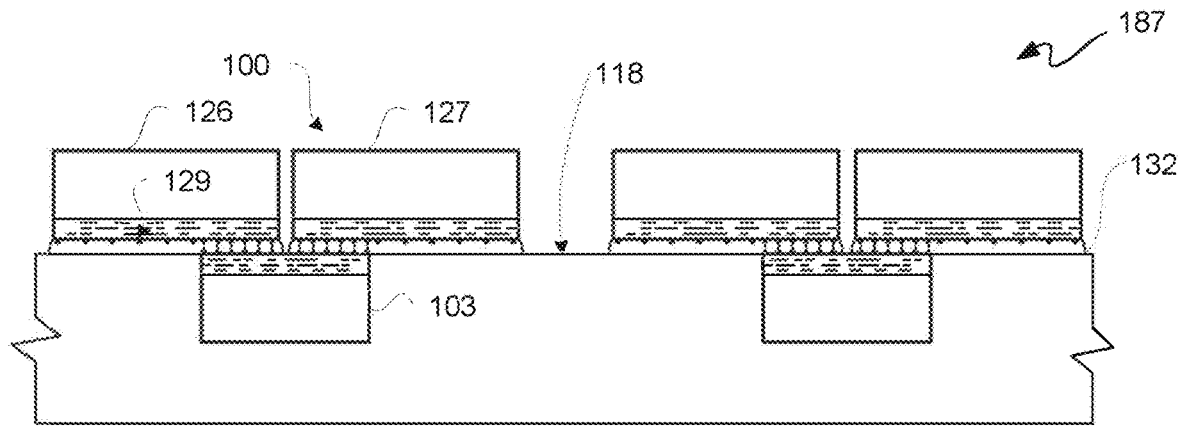
Figures 1, 2, 3, 4, 5, 6, 7, 8:
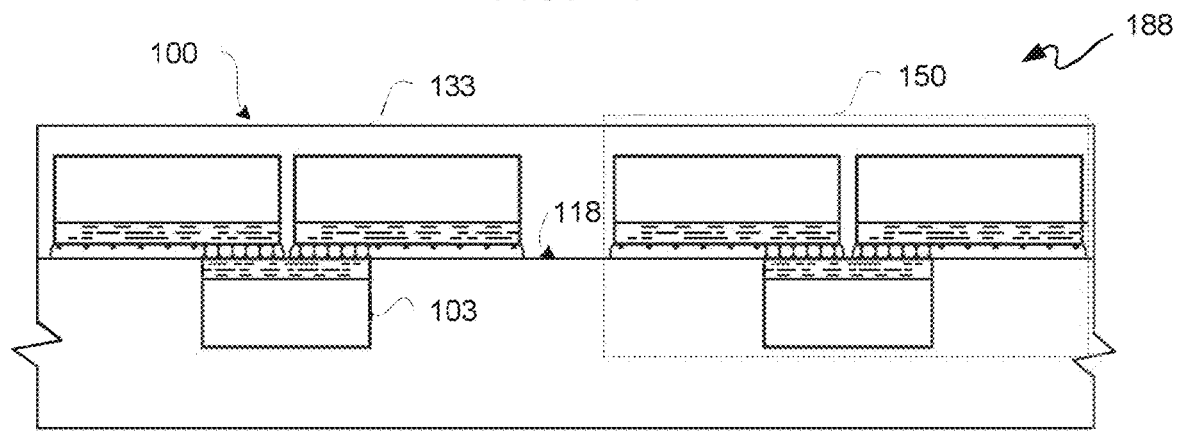
Figures 1, 2, 3, 4, 5, 6, 7, 8, 9:
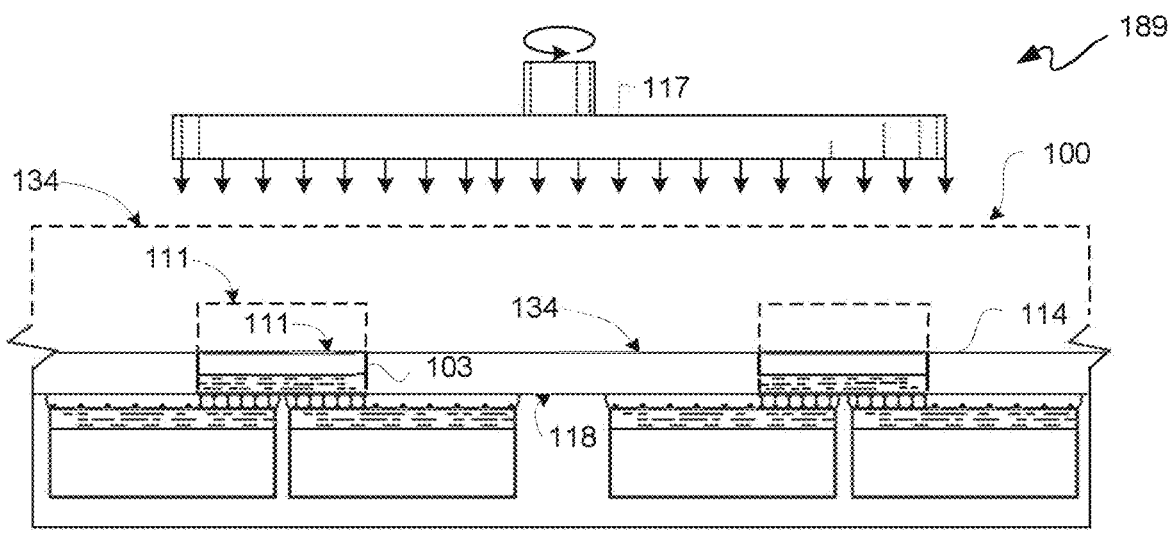
Figures 1, 2, 3, 4, 5, 6, 7, 8, 9, 10:
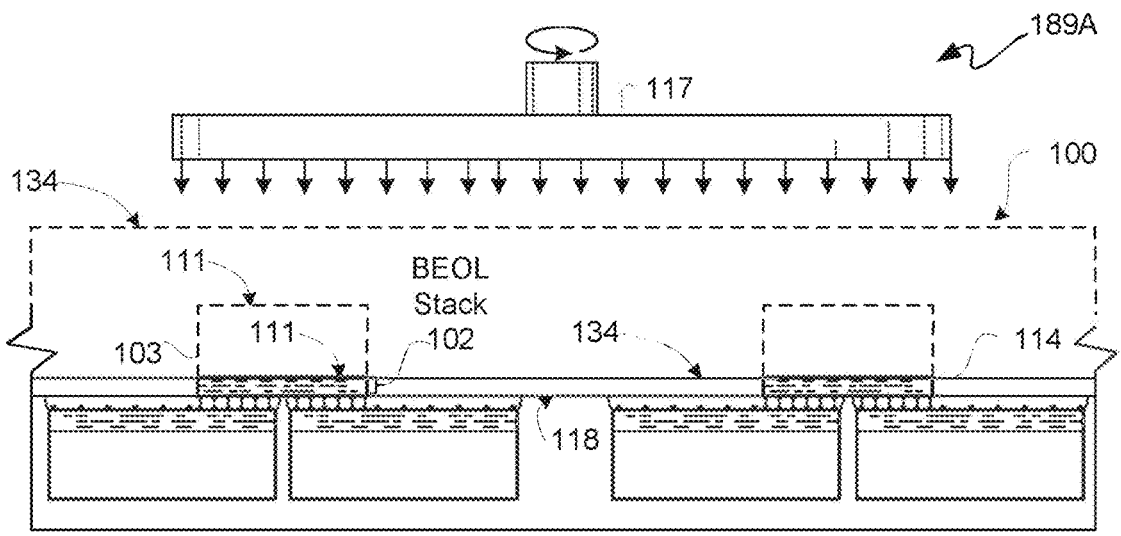
Figures 1, 2, 3, 4, 5, 6, 7, 8, 9, 10, 11:
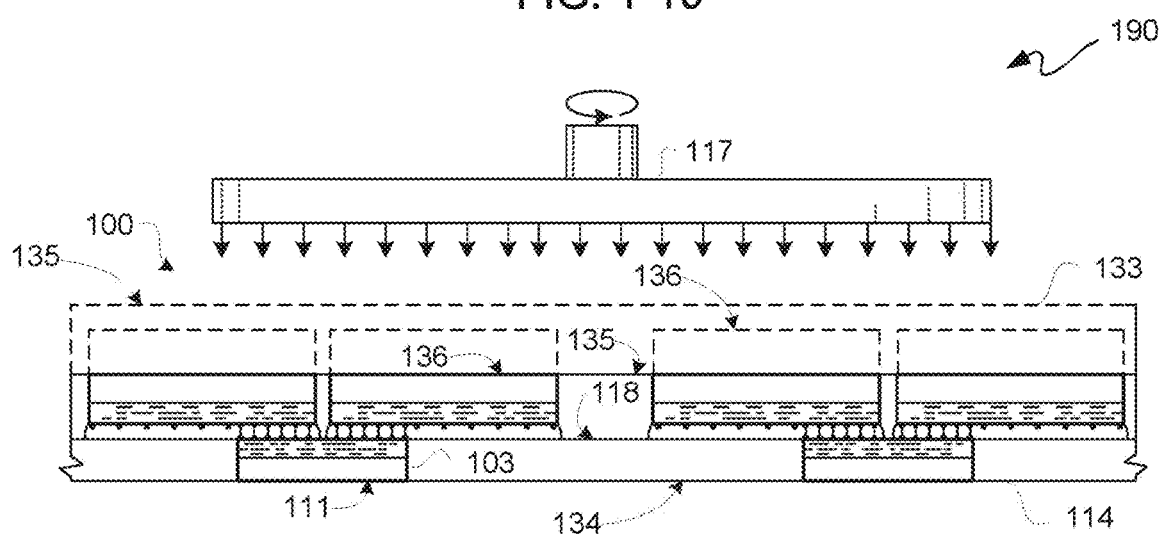
Figures 1, 2, 3, 4, 5, 6, 7, 8, 9, 10, 11, 12:
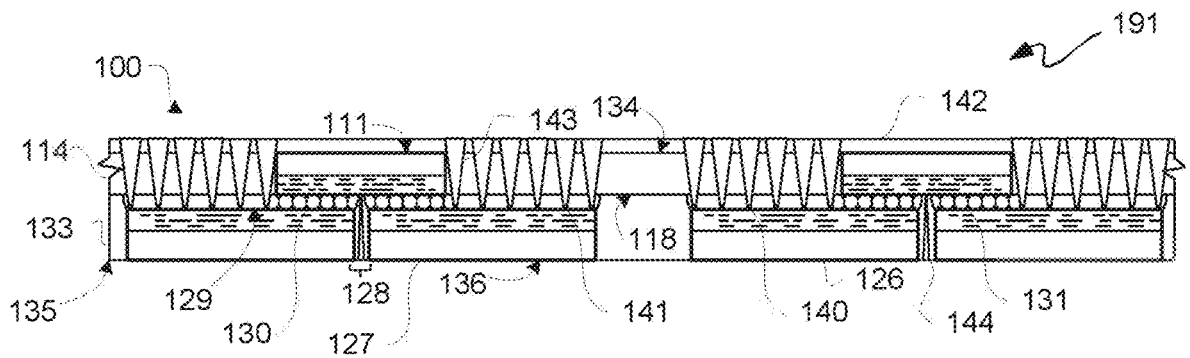
Figures 1, 2, 3, 4, 5, 6, 7, 8, 9, 10, 11, 12, 13:
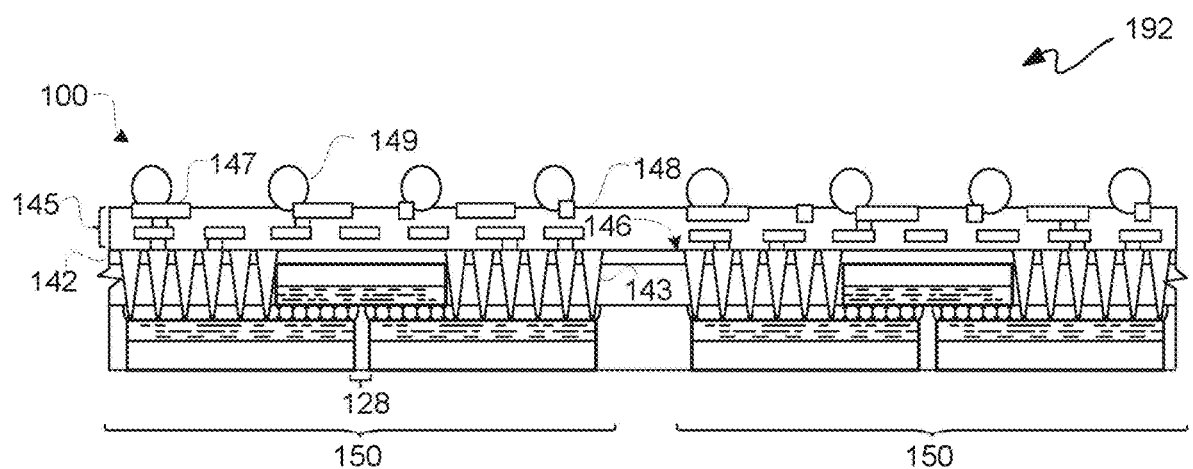
Figures 1, 2, 3, 4, 5, 6, 7, 8, 9, 10, 11, 12, 13, 14:
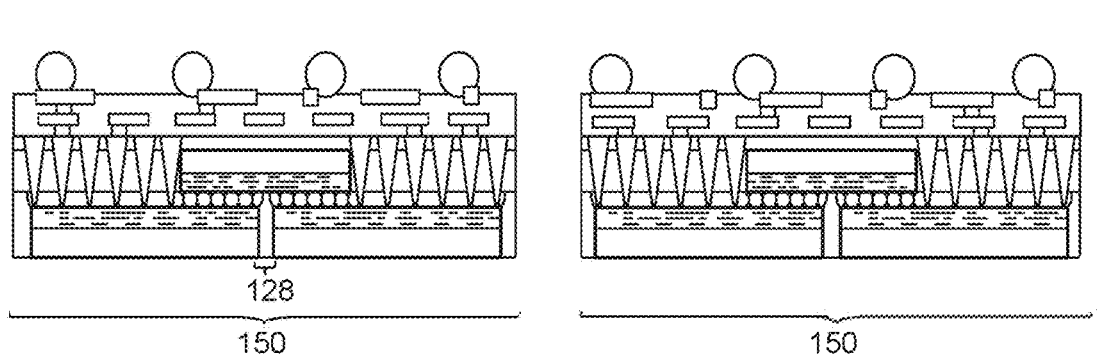
Figures 1, 2:
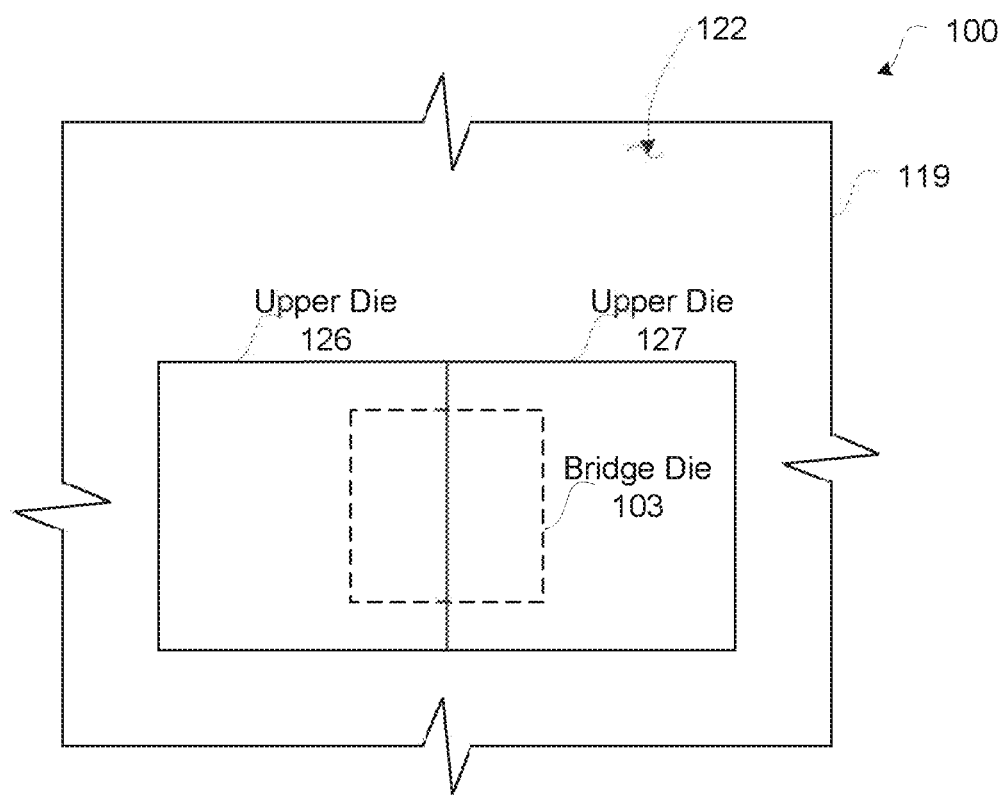
Figure 2:
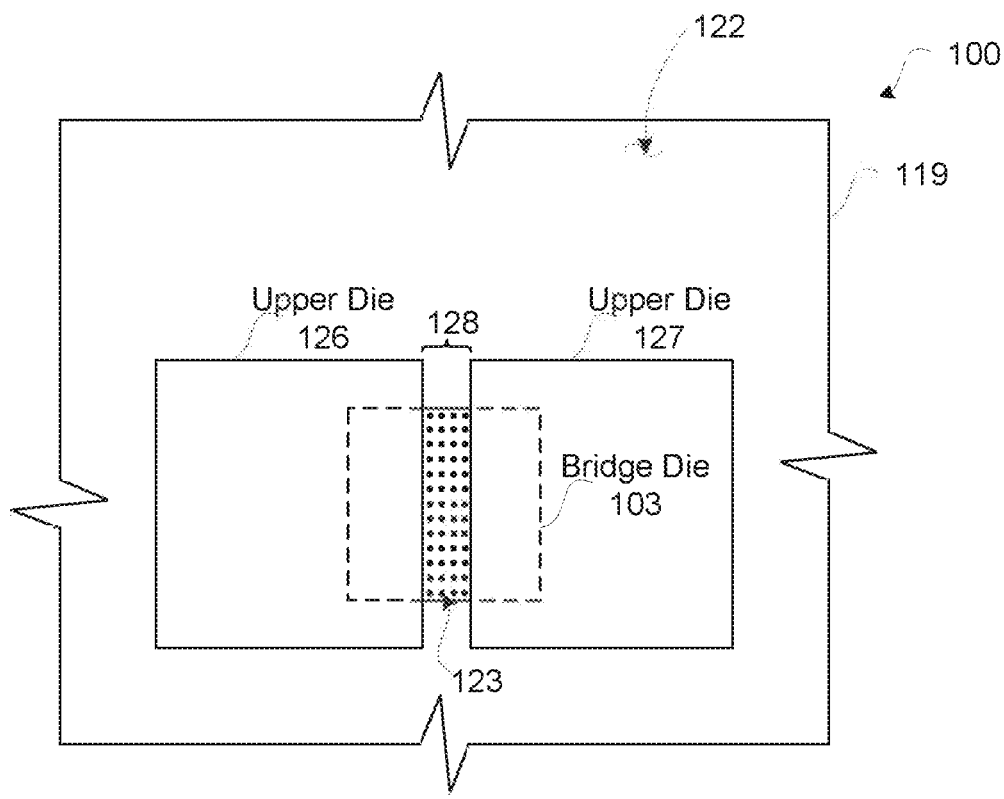
Figure 3:
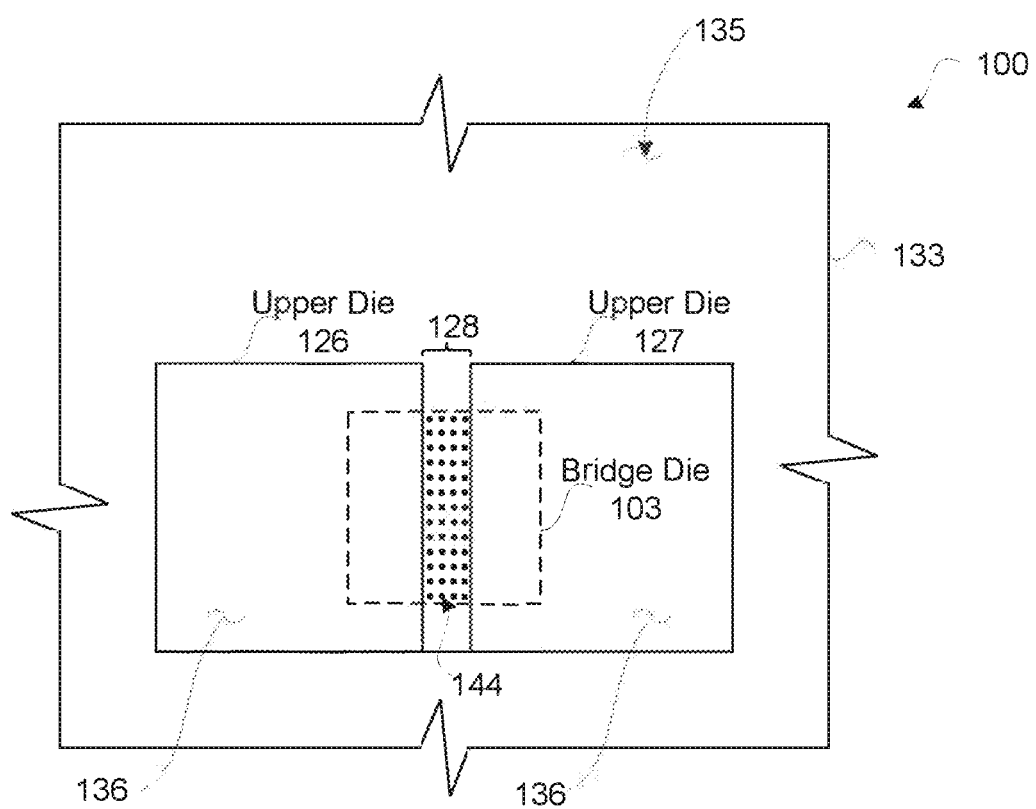
Figures 1, 4:
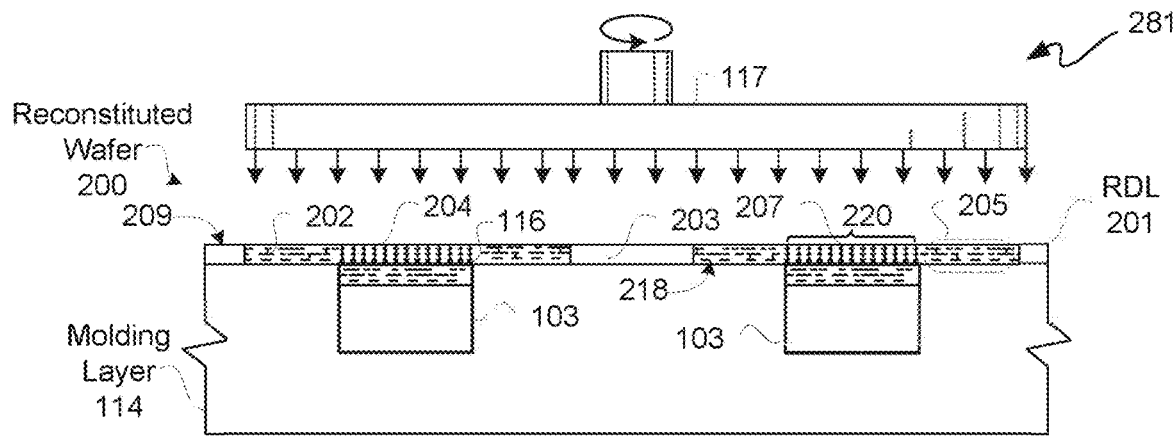
Figures 2, 4:
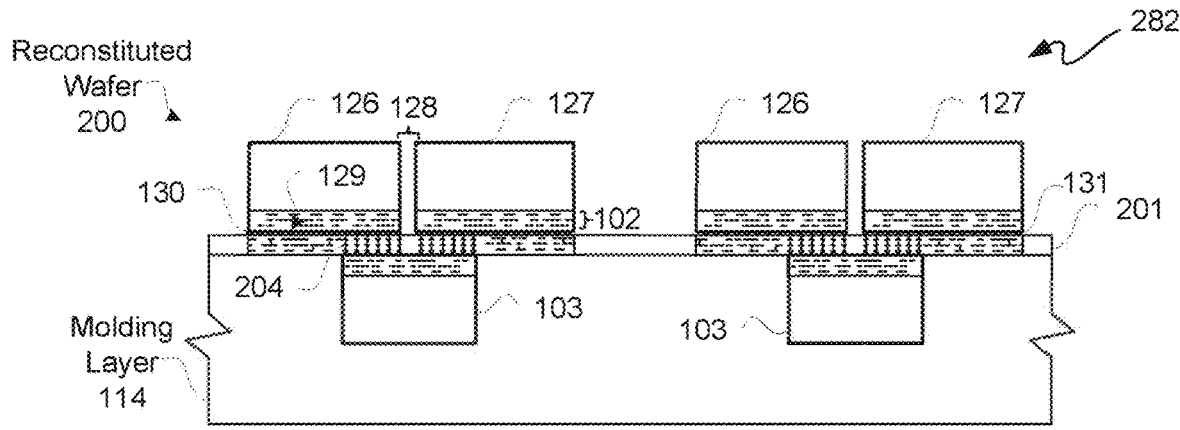
Figures 3, 4:
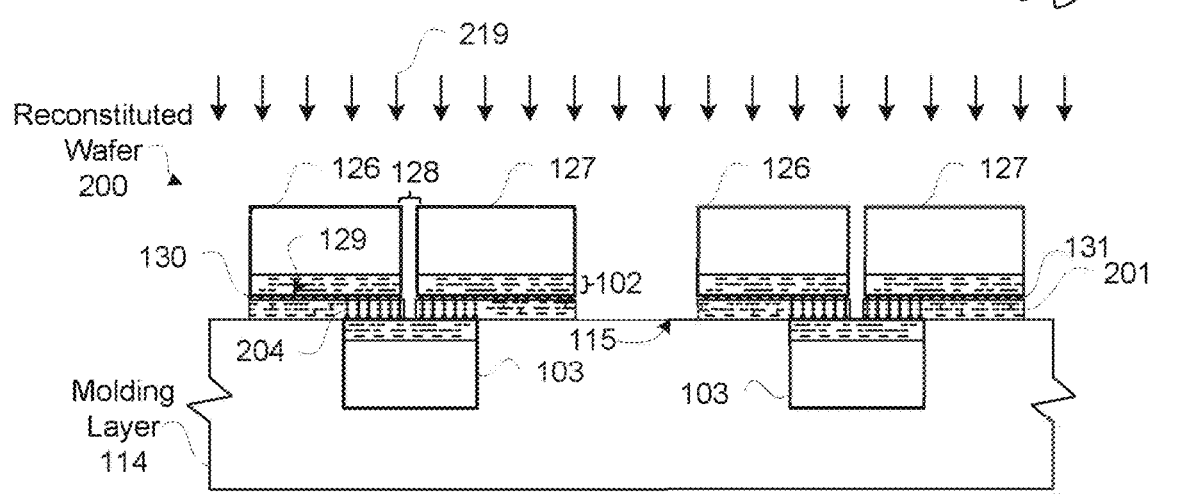
Figure 4:
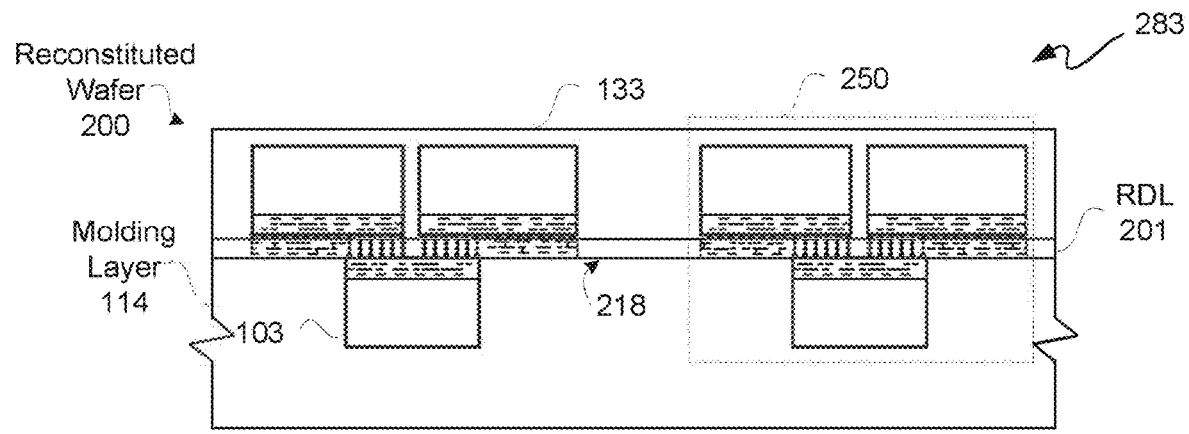
Figures 4, 5:
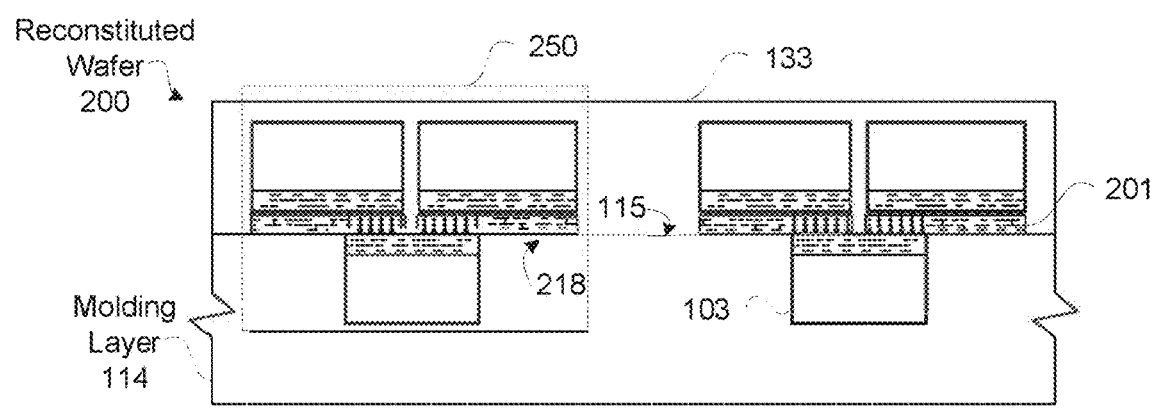
Figures 4, 5, 6:
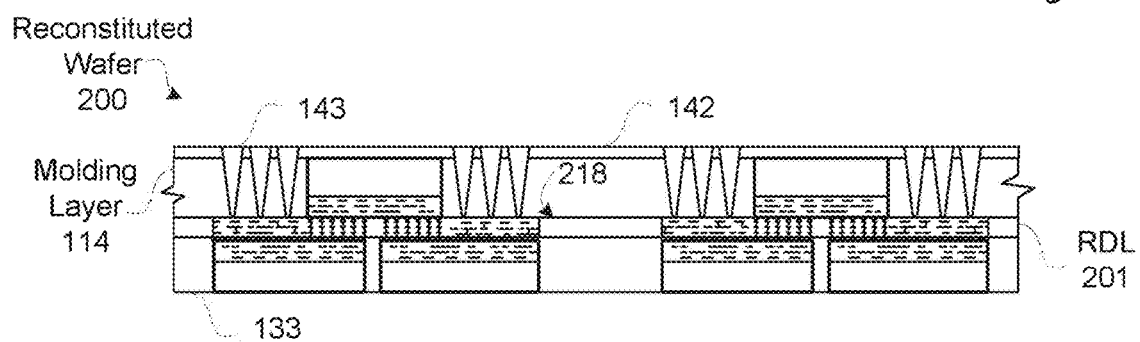
Figure 5:
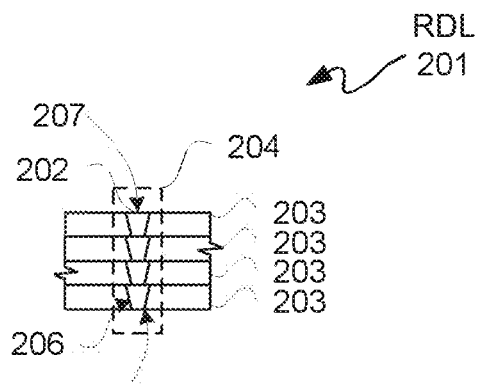
Figure 6:
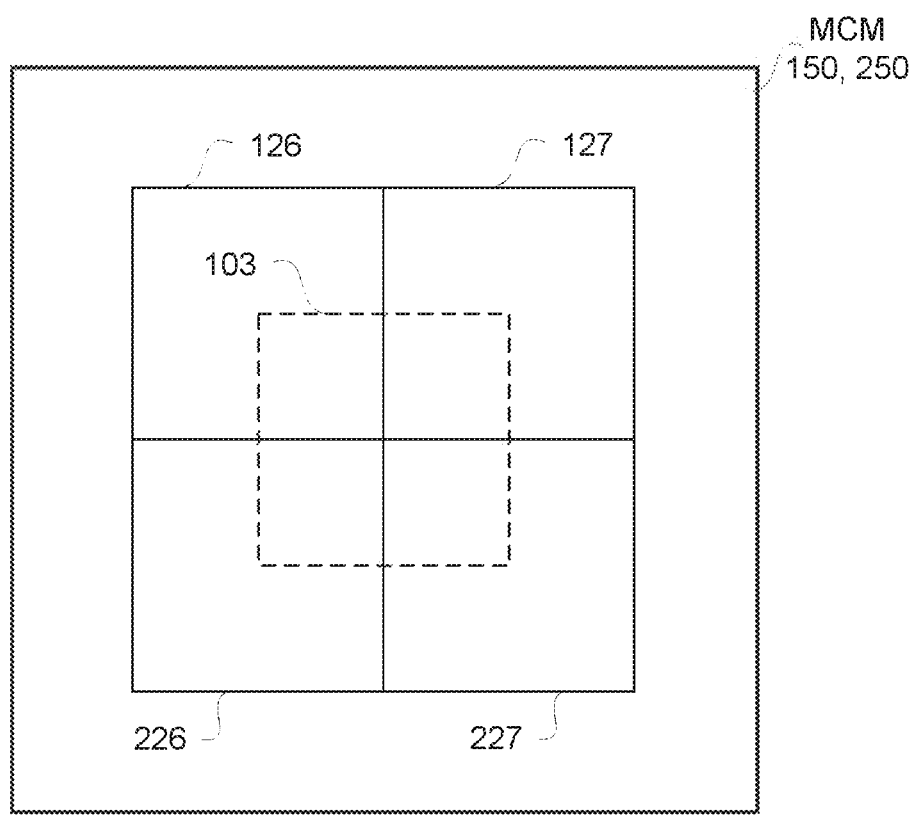

Relaxing coplanarity is even more beneficial for an MCM having more than two IC dies bridged by a bridge die 103. Along those lines, FIG. 6 is a block diagram of a top-down view depicting an exemplary MCM 150 or 250 having four IC dies 126, 127, 226, and 227 bridged by a same bridge die 103. Top ends of conductors attached to bridge die 103 may be used as alignment features for alignment of IC dies 126, 127, 226, and 227 to bridge die 103.

Additionally, in a mezzanine RDL 201 configuration between bridged IC dies and a bridge die 103, more interconnections may be made using such RDL 201, which may reduce the number of through-mold vias needed for power, ground, and input/output interconnects. This may reduce the impact of an MCM interface to a PCB owing to a larger pitch of through-mold vias ("TMVs") limiting the number of such TMVs.

As previously described, a reconstituted wafer 100 and/or 200 may be thinned or surfaced down. This thinning may be used to provide a "low profile" MCM 150 and/or 250. Such a low profile MCM may be less than approximately 200 microns. Furthermore, bridge die 103 may be formed without through-substrate vias ("TSVs"), as TMVs may be used for interconnection without such TSVs. This avoidance of TSVs may reduce costs and improve reliability.

Additionally, having one or more RDLs, either or both of which may be formed for example with a laminate process for providing routing, may lower cost over a conventional 2.5D MCM that uses an interposer die for such routing. In the above-described MCMs 150 and 250, no interposer die is used.

While the foregoing describes exemplary embodiment(s) in accordance with one or more aspects of the disclosure, other and further embodiment(s) in accordance with the one or more aspects of the disclosure may be devised without departing from the scope thereof, which is determined by the claim(s) that follow and equivalents thereof. Each claim of this document constitutes a separate embodiment, and embodiments that combine different claims and/or different embodiments are within the scope of the disclosure and will be apparent to those of ordinary skill in the art after reviewing this disclosure. Claim(s) listing steps do not imply any order of the steps. Trademarks are the property of their respective owners.

What is claimed is:

1. A microelectronic device comprising:
a reconstituted portion having a first surface and a second surface opposite the first surface, the reconstituted portion comprising:
a bridge die having a plurality of contacts having a bridge contact pitch at a contact surface of the bridge die, the contact surface opposite a back surface of the bridge die, the back surface spaced apart from the contact surface along a vertical direction, wherein an insulating layer is disposed on the back surface of the bridge die such that the back surface of the bridge die is vertically offset from the second surface of the reconstituted portion, the back surface disposed between the first and second surfaces of the reconstituted portion along the vertical direction;
a first molding compound disposed along at least one side surface of the bridge die between the first and second surfaces of the reconstituted portion; and
a plurality of in-mold vias extending through the first molding compound, the plurality of in-mold vias including a first in-mold via and a second in-mold via disposed adjacent the first in-mold via, the first and second in-mold vias spaced apart by a via spacing larger than the bridge contact pitch;
a redistribution layer (RDL) formed on the first surface of the reconstituted portion and extending over the bridge die, the first molding compound, and the plurality of in-mold vias, the RDL including conductive routing comprising lateral metal traces and vertical metal vias, the conductive routing connected to first and second contacts of the plurality of contacts of the bridge die and to first ends of the in-mold vias, second ends of the in-mold vias extending to the second surface of the reconstituted portion such that the second ends of the in-mold vias are offset from the back surface of the bridge die along the vertical direction;
a first integrated circuit die having third and fourth contacts in a back-end-of-line (BEOL) stack of the first integrated circuit die, the third and fourth contacts electrically connected to the RDL by way of first and second bumps, the RDL providing electrical communication between the third contact and the first in-mold via of the plurality of in-mold vias and providing electrical communication between the fourth contact of the first integrated circuit die and the first contact of the bridge die; and
a second integrated circuit die having fifth and sixth contacts in a BEOL stack of the second integrated device die, the fifth and sixth contacts electrically connected to the RDL by way of third and fourth bumps, the RDL providing electrical communication between the fifth contact and a third in-mold via of the plurality of in-mold vias and providing electrical communication between the sixth contact of the second integrated circuit die and the second contact of the bridge die,
wherein the first integrated circuit die includes a first plurality of contacts disposed over the first molding compound and a second plurality of contacts disposed over the bridge die, the first plurality of contacts having a first pitch that is different from a second pitch of the second plurality of contacts.

2. The microelectronic device according to claim 1, further comprising a second molding compound over the RDL and in which the first and second integrated circuit dies are at least partially embedded.

3. The microelectronic device according to claim 2, wherein a first portion of the second molding compound is disposed between the first and second integrated circuit dies.

4. The microelectronic device according to claim 3, wherein a second portion of the second molding compound is disposed about respective peripheral sides of the first and second integrated circuit dies.

5. The microelectronic device according to claim 1, further comprising an interconnect structure attached to the second surface of the reconstituted portion and electrically connected to the second ends of the in-mold vias at the second surface.

6. The microelectronic device according to claim 5, wherein the interconnect structure comprises a package substrate.

7. The microelectronic device according to claim 1, wherein the first integrated circuit die and second integrated circuit die partially overlap the bridge die.

8. The microelectronic device according to claim 1, wherein the first integrated circuit die and the second integrated circuit die are electrically connected.

9. The microelectronic device according to claim 1, wherein the bridge die comprises a passive die.

10. The microelectronic device according to claim 1, wherein the bridge die comprises an active die.

11. The microelectronic device according to claim 1, wherein the plurality of in-mold vias comprises copper.

12. The microelectronic device according to claim 1, wherein the first integrated circuit die includes a first plurality of contacts including the third contact and a second plurality of contacts including the fourth contact, the first plurality of contacts connected to in-mold vias of the plurality of in-mold vias, the second plurality of contacts connected to contacts of the plurality of contacts of the bridge die, the first plurality of contacts having a first pitch that is different from a second pitch of the second plurality of contacts.

13. The microelectronic device of claim 1, wherein the bridge contact pitch is less than approximately 60 microns.

14. The microelectronic device of claim 1, wherein the first plurality of contacts includes the third contact and wherein the second plurality of contacts includes the fourth contact.

15. The microelectronic device of claim 6, further comprising a plurality of solder balls electrically connected to the package substrate, wherein a solder ball pitch of the plurality of solder balls is larger than the via spacing.

16. The microelectronic device of claim 12, wherein at least one of the first and second pitches is less than approximately 60 microns.

17. The microelectronic device of claim 1, wherein a space between the first in-mold via and the second in-mold via is filled with the first molding compound.

18. A microelectronic device comprising:
  a bridge die at least partially embedded in a first molding compound, at least one in-mold via extending through the first molding compound and having a first end and a second end opposite the first end, the bridge die having a contact surface and a back surface opposite the contact surface, the back surface spaced apart from the contact surface along a vertical direction, wherein an insulating layer is disposed on the back surface of the bridge die such that the back surface of the bridge die is vertically offset from the second end of the in-mold via, the back surface disposed between the second end of the in-mold via and the contact surface along the vertical direction;
  a redistribution layer (RDL) disposed over the contact surface of the bridge die, the first molding compound, and the at least one in-mold via, the RDL including conductive routing comprising lateral metal traces and vertical metal vias, the conductive routing connected to the bridge die and to the first end of the at least one in-mold via;
  a first integrated circuit die having a first plurality of contacts in a back-end-of-line (BEOL) stack of the first integrated circuit die, the first plurality of contacts electrically connected to the RDL by way of a first plurality of bumps, the RDL providing electrical communication between the first integrated circuit die and the bridge die and between the first integrated circuit die and the at least one in-mold via, the first plurality of contacts including a first set of contacts disposed over the first molding compound and a second set of contacts disposed over the bridge die, the first set of contacts having a first pitch different from a second pitch of the second set of contacts; and
  a second integrated circuit die having a second plurality of contacts in a back-end-of-line (BEOL) stack of the second integrated circuit die, the second plurality of contacts electrically connected to the RDL by way of a second plurality of bumps, the RDL providing electrical communication between the second integrated circuit die and the bridge die.

19. The microelectronic device of claim 18, wherein the at least one in-mold via comprises a plurality of in-mold vias, the RDL providing electrical communication between the first integrated circuit die and a first in-mold via of the plurality of in-mold vias and between the second integrated circuit die and a second in-mold via of the plurality of in-mold vias.

20. The microelectronic device according to claim 18, further comprising a second molding compound over the RDL and in which the first and second integrated circuit dies are at least partially embedded.

21. The microelectronic device according to claim 20, wherein a first portion of the second molding compound is disposed between the first and second integrated circuit dies.

22. The microelectronic device according to claim 21, wherein a second portion of the second molding compound is disposed about respective peripheral sides of the first and second integrated circuit dies.

23. The microelectronic device according to claim 18, further comprising an interconnect structure positioned at a side of the bridge die opposite the RDL, the interconnect structure electrically connected to the second end of the at least one in-mold via.

24. The microelectronic device according to claim 23, wherein the interconnect structure comprises.

25. The microelectronic device of claim 18, wherein the at least one in-mold via comprises a plurality of in-mold vias, wherein the first set of contacts is connected to the plurality of in-mold vias by way of the RDL and the second set of contacts is connected to the bridge die by way of the RDL.

26. The microelectronic device of claim 18, wherein the bridge die includes a plurality of contacts having a bridge contact pitch at a surface of the bridge die, wherein the at least one in-mold via comprises a first in-mold via and a second in-mold via disposed adjacent the first in-mold via, the first and second in-mold vias spaced apart by a via spacing larger than the bridge contact pitch.

27. The microelectronic device of claim 19, wherein a space between the first in-mold via and the second in-mold via is filled with the first molding compound.

28. A microelectronic device comprising:
  a reconstituted portion having a first surface and a second surface opposite the first surface, the reconstituted portion comprising:
    a bridge die having a plurality of contacts having a bridge contact pitch at a contact surface of the bridge die, the contact surface opposite a back surface of the bridge die, the back surface spaced apart from the contact surface along a vertical direction, wherein an insulating layer is disposed on the back surface of the bridge die such that the back surface of the bridge die is vertically offset from the second surface of the reconstituted portion, the back surface disposed between the first and second surfaces of the reconstituted portion along the vertical direction;
    a first molding compound disposed along at least one side surface of the bridge die between the first and second surfaces of the reconstituted portion; and
    a plurality of in-mold vias extending through the first molding compound, the plurality of in-mold vias including a first in-mold via and a second in-mold via disposed adjacent the first in-mold via, the first and second in-mold vias spaced apart by a via spacing larger than the bridge contact pitch;
  a redistribution layer (RDL) formed on the first surface of the reconstituted portion and extending over the bridge die, the first molding compound, and the plurality of in-mold vias, the RDL including conductive routing comprising lateral metal traces and vertical metal vias, the conductive routing connected to first and second contacts of the plurality of contacts of the bridge die and to first ends of the in-mold vias, second ends of the in-mold vias extending to the second surface of the reconstituted portion such that the second ends of the in-mold vias are offset from the back surface of the bridge die along the vertical direction;

a first integrated circuit die having third and fourth contacts in a back-end-of-line (BEOL) stack of the first integrated circuit die, the third and fourth contacts electrically connected to the RDL by way of first and second bumps, the RDL providing electrical communication between the third contact and the first in-mold via of the plurality of in-mold vias and providing electrical communication between the fourth contact of the first integrated circuit die and the first contact of the bridge die; and a second integrated circuit die having fifth and sixth contacts in a BEOL stack of the second integrated device die, the fifth and sixth contacts electrically connected to the RDL by way of third and fourth bumps, the RDL providing electrical communication between the fifth contact and a third in-mold via of the plurality of in-mold vias and providing electrical communication between the sixth contact of the second integrated circuit die and the second contact of the bridge die, wherein the first integrated circuit die includes a first plurality of contacts including the third contact and a second plurality of contacts including the fourth contact, the first plurality of contacts connected to in-mold vias of the plurality of in-mold vias, the second plurality of contacts connected to contacts of the plurality of contacts of the bridge die, the first plurality of contacts having a first pitch that is different from a second pitch of the second plurality of contacts.

29. The microelectronic device of claim 28, further comprising a second molding compound over the RDL and in which the first and second integrated circuit dies are at least partially embedded.

30. The microelectronic device of claim 28, wherein the first integrated circuit die and the second integrated circuit die partially overlap the bridge die.

* * * * *